United States Patent
Yeh et al.

(10) Patent No.: US 9,412,752 B1
(45) Date of Patent: Aug. 9, 2016

(54) REFERENCE LINE AND BIT LINE STRUCTURE FOR 3D MEMORY

(71) Applicant: MACRONIX INTERNATIONAL CO., LTD., Hsinchu (TW)

(72) Inventors: Teng-Hao Yeh, Hsinchu (TW); Chih-Wei Hu, Miaoli (TW); Yu-Wei Jiang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/861,377

(22) Filed: Sep. 22, 2015

(51) Int. Cl.
*H01L 27/115* (2006.01)
*H01L 27/105* (2006.01)

(52) U.S. Cl.
CPC ...... *H01L 27/11565* (2013.01); *H01L 27/1052* (2013.01); *H01L 27/1157* (2013.01); *H01L 27/11582* (2013.01)

(58) Field of Classification Search
CPC ............ H01L 27/1052; H01L 27/1157; H01L 27/11582; H01L 27/0688
See application file for complete search history.

(56) References Cited

U.S. PATENT DOCUMENTS

| | | | |
|---|---|---|---|
| 6,906,940 B1 | 6/2005 | Lue | |
| 7,315,474 B2 | 1/2008 | Lue | |
| 7,420,242 B2 | 9/2008 | Lung | |
| 7,696,559 B2 | 4/2010 | Arai et al. | |
| 7,851,849 B2 | 12/2010 | Kiyotoshi | |
| 8,008,732 B2 | 8/2011 | Kiyotoshi et al. | |
| 8,363,476 B2 | 1/2013 | Lue et al. | |
| 8,467,219 B2 | 6/2013 | Lue | |
| 8,503,213 B2 | 8/2013 | Chen et al. | |
| 8,648,438 B2 | 2/2014 | Cai et al. | |
| 8,759,899 B1 | 6/2014 | Lue et al. | |
| 8,853,818 B2 | 10/2014 | Lue | |
| 9,147,468 B1 | 9/2015 | Lue | |
| 2005/0280061 A1 | 12/2005 | Lee | |
| 2007/0045708 A1 | 3/2007 | Lung | |
| 2007/0158736 A1 | 7/2007 | Arai et al. | |

(Continued)

FOREIGN PATENT DOCUMENTS

EP 2048709 A2 4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Mohsen Ahmadi
(74) *Attorney, Agent, or Firm* — Haynes Beffel & Wolfeld LLP

(57) ABSTRACT

A 3D NAND flash memory includes even and odd stacks of conductive strips. Some of the conductive strips in the stacks are configured as word lines. Data storage structures are disposed on the sidewalls of the even and odd stacks. Active pillars include even and odd semiconductor films on the data storage structures connected at the bottom ends so that the semiconductor films can be thin films having a U-shaped current path. An even pad connected to the even semiconductor film and an odd pad connected to the odd semiconductor film are disposed over the even and odd stacks respectively. A segment of a reference line is connected to the even pad, and an inter-level connector is connected to the odd pad. A segment of a bit line comprises an extension contacting the inter-level connector.

17 Claims, 26 Drawing Sheets

(56) References Cited

U.S. PATENT DOCUMENTS

| | | | |
|---|---|---|---|
| 2007/0252201 A1 | 11/2007 | Kito et al. | |
| 2008/0073635 A1 | 3/2008 | Kiyotoshi et al. | |
| 2008/0175032 A1 | 7/2008 | Tanaka et al. | |
| 2008/0180994 A1 | 7/2008 | Katsumata et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |
| 2011/0018051 A1 | 1/2011 | Kim et al. | |
| 2011/0140070 A1* | 6/2011 | Kim | G11C 5/02 257/5 |
| 2012/0068241 A1 | 3/2012 | Sakuma et al. | |
| 2012/0119283 A1 | 5/2012 | Lee et al. | |
| 2012/0182806 A1 | 7/2012 | Chen et al. | |
| 2013/0119455 A1* | 5/2013 | Chen | H01L 27/11578 257/324 |
| 2014/0264541 A1* | 9/2014 | Rhie | H01L 29/792 257/324 |
| 2015/0048434 A1* | 2/2015 | Rhie | H01L 21/28008 257/314 |
| 2016/0141337 A1* | 5/2016 | Shimabukuro | H01L 27/2481 365/51 |

OTHER PUBLICATIONS

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/637,204, filed Mar. 3, 2015 entitled "U-Shaped Vertical Thin-Channel Memory," by Hang-Ting Lue, 78 pages.

U.S. Appl. No. 14/309,622 entitled "Bandgap-engineered Memory With Multiple Charge Trapping Layers Storing Charge," by Hang-Ting Lue, filed Jun. 19, 2014, 108 pages.

U.S. Appl. No. 14/637,187 entitled "Vertical Thin-Channel Memory," by Hang-Ting Lue, filed Mar. 3, 2015, 90 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

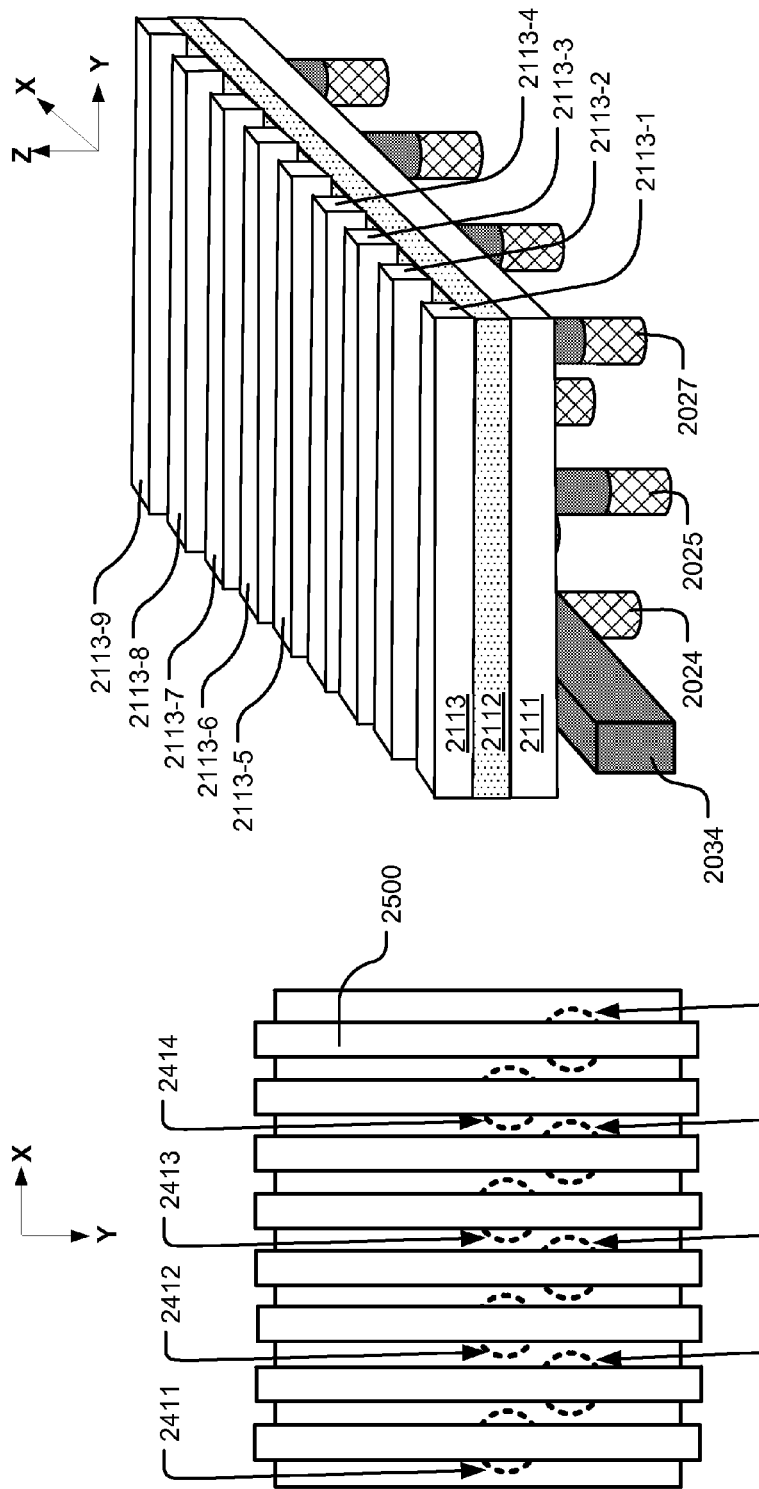

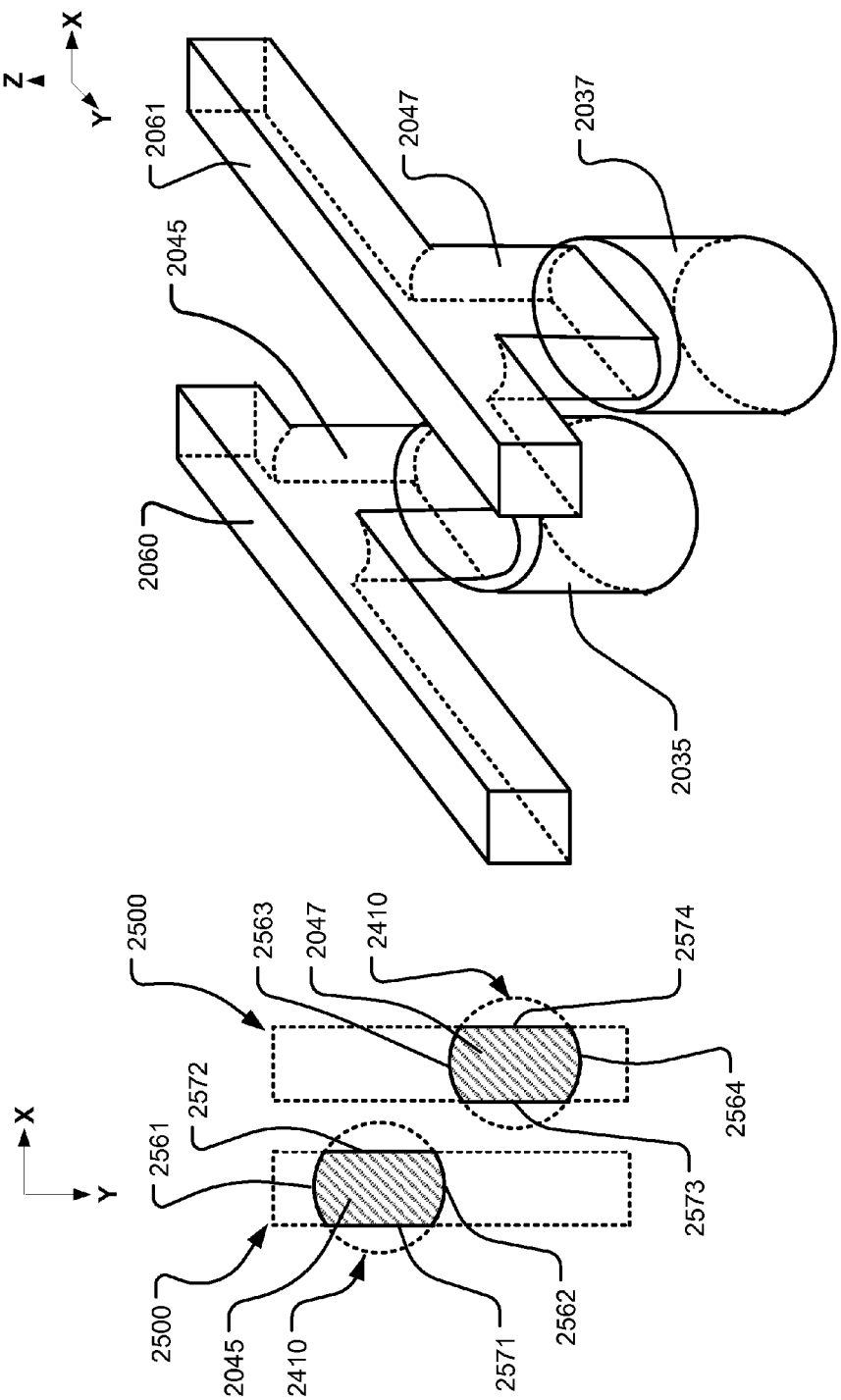

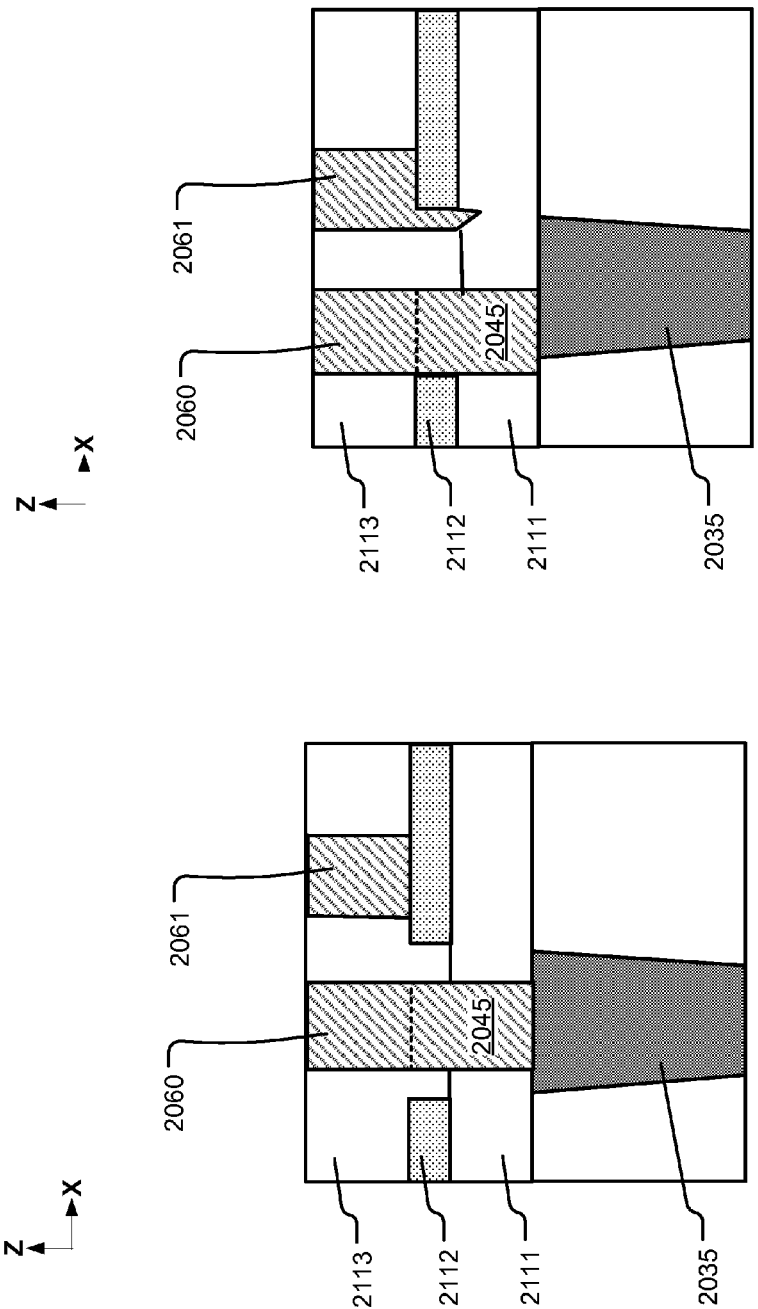

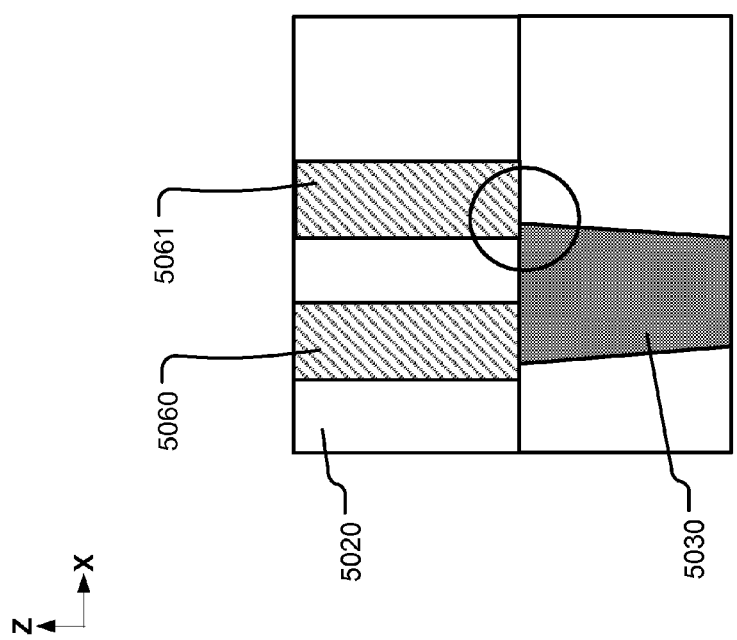

REFERENCE LINE AND BIT LINE STRUCTURE FOR 3D MEMORY

BACKGROUND

1. Technical Field

The present application relates to memory devices, and particularly to 3D array memory devices in which bit lines and common source lines are arranged to provide a simple routing structure.

2. Description of Related Art

As critical dimensions of devices in integrated circuits shrink to the limits of common memory cell technologies, designers look for techniques to stack multiple levels of memory cells to achieve greater storage capacity and lower costs per bit. For example, thin film transistor techniques are applied to charge trapping memory technologies in Lai et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon (SONOS) charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate-all-around the cell at each layer.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high-density three-dimensional flash technologies, the density of data storage can be limited.

Because of the complex backend of line (BEOL) routings, low yield and high cost are critical issues in the manufacture of three-dimensional memory.

It is desirable to provide a structure for three-dimensional integrated circuit memory with low manufacturing cost and simple BEOL routings, including reliable, very small memory elements, and high data densities.

SUMMARY

A 3D array of U-shaped NAND strings comprising series-connected even and odd memory cells is described. Even memory cells are disposed in the interface regions accessible via the active pillars and conductive strips in the even stacks of conductive strips. Odd memory cells are disposed in the interface regions accessible via the active pillars and conductive strips in the odd stacks of conductive strips. A top frustum of the active pillar includes a first switch on the even side controlled by a signal on a top strip in the even stack, and a second switch on the odd side controlled by a signal on a top strip in the odd stack. The first switch (e.g. the gate select transistor) can be used to connect the NAND string to a reference line, acting as a common source line, and the second switch (e.g. the string select transistor) can be used to connect the NAND string through an inter-level connector to a bit line having an extension. The reference line and the inter-level connector are in the first level of patterned conductors, and the bit line with the associated extension is in the second level of patterned conductors. The first level is the first metal layer formed in the 3D memory array. Control circuitry is configured to apply different bias voltages to the even and odd conductive strips, and can be configured to execute a program operation by which one, or more than one, bit of data can be stored in both the even memory cell and odd memory cell in a given frustum of a selected active strip.

Methods for manufacturing memory devices as described herein are also provided. In one aspect, a method for manufacturing includes forming a first level of patterned conductors over even and odd stacks of conductive strips, the first level of patterned conductors comprising a reference line, acting as a common line source, over the even stack, and inter-level connectors over the odd stack. A dual damascene process is used to form a second level of patterned conductors comprising a bit line with associated extensions connected to the corresponding inter-level connectors.

Other aspects and advantages of the present invention can be seen on review of the drawings, the detailed description and the claims, which follow.

BRIEF DESCRIPTION OF THE DRAWINGS

FIGS. 18A, 18B, 19A, 19B, 20A, 20B, 21A and 21B illustrate simplified structures during manufacturing stages for forming the second level of patterned conductors illustrated in FIG. 16.

FIG. 22A is an enlarged cross-section of a portion of FIG. 21B in the XY plane.

FIG. 22B is an enlarged perspective view of the bit lines.

FIG. 23A is a cross-section on line AA' of FIG. 21B showing no misalignment.

FIG. 23B is a cross-section on line AA' of FIG. 21B showing misalignment.

FIG. 24 is a cross-section of a device formed without using a dual damascene process showing misalignment.

DETAILED DESCRIPTION

A detailed description of embodiments of the present application is provided with reference to the FIGS. 1-27.

Figure 1:
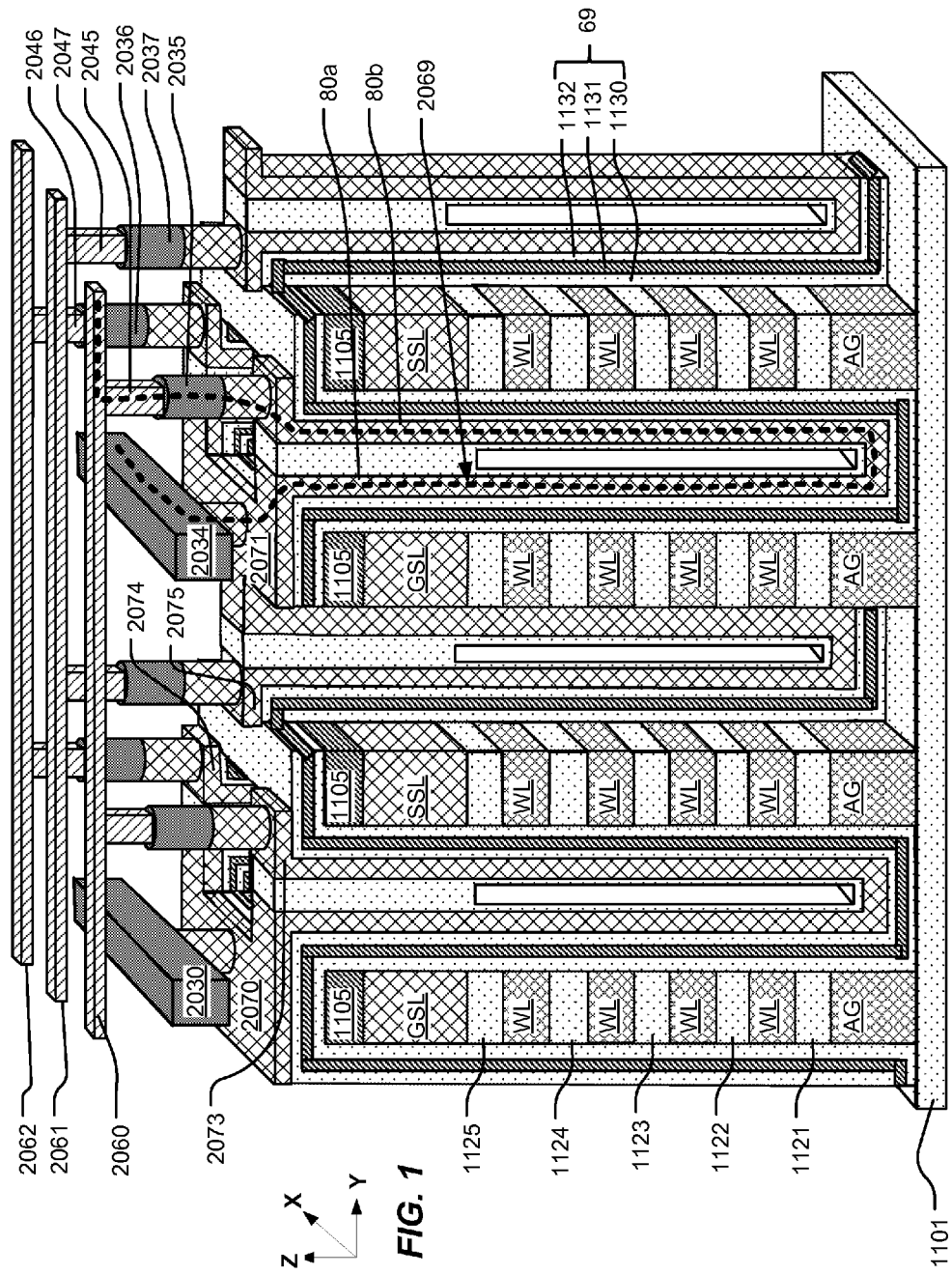
FIG. 1 is a perspective view of a 3D memory device including vertical channel structures.

FIG. 1 is a perspective view of a three-dimensional 3D memory device. The memory device described herein comprises a plurality of stacks having alternating layers of conductive strips (GSL, SSL, WL, AG) and insulating material (1121-1125), data storage structures 69 disposed on the sides of the stacks, and vertical channel films 80a/80b contacting data storage structures 69. Over the stacks are disposed common source lines, such as reference lines 2030, 2034, and bit lines 2060-2062. Circuit path 2069 shows the current flow for a U-shaped NAND string. The combination of vertical channel films 80a/80b and data storage structures 69 is referred to herein as an active pillar.

Figure 2:
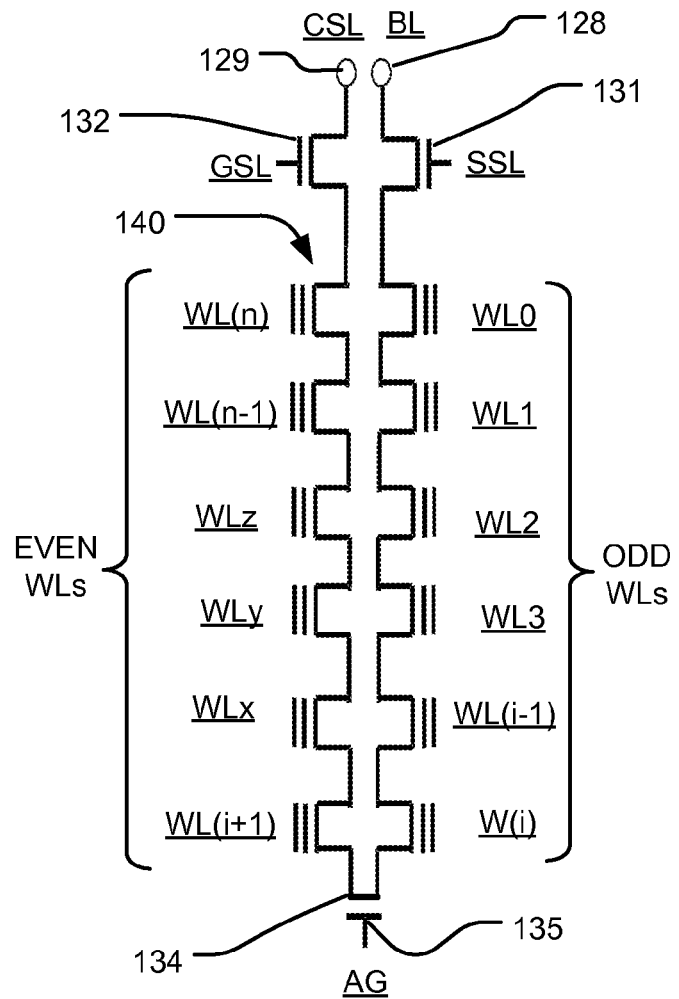
FIG. 2 is a schematic circuit diagram of a U-shaped NAND string on a single active pillar in a structure as described herein.

FIG. 2 shows a circuit schematic for a U-shaped NAND, corresponding to the circuit path 2069 from reference line 2034 to bit line 2060 shown in FIG. 1. The U-shaped NAND string is connected between a bit line contact 128 and a common source line contact 129. The active pillar is disposed between even and odd stacks of conductors, where an upper level in the odd stack in this example includes a string select line which acts as a gate for a first switch 131 in the NAND string, and an upper level in the even stack includes a ground select line which acts as a gate for a second switch 132 in the same NAND string. Intermediate levels in the stack include even and odd word lines, where the odd word lines include word line WL0 to word line WL(i), and the even word lines include word line WL(i+1) to word line WL(n). At the bottom 134 of the stack, the semiconductor thin films providing the thin-channel structures are electrically connected, such as being formed by a single continuous thin film which lines the space between the stacks of conductive strips. In the illustrated embodiment, an assist gate structure 135 is included which is coupled by a gate dielectric to the semiconductor thin film in the bottom of the stack. The assist gate structure 135 can be used to induce an inversion region that improves the conductivity of the strip between the even and odd sides. This assist gate can be implemented using a doped region in the substrate beneath the active pillars, or using other techniques. The U-shaped strings comprise series-connected even memory cells disposed on the side of the even stack and odd memory cells disposed on the side of the odd stack.

Figure 3:
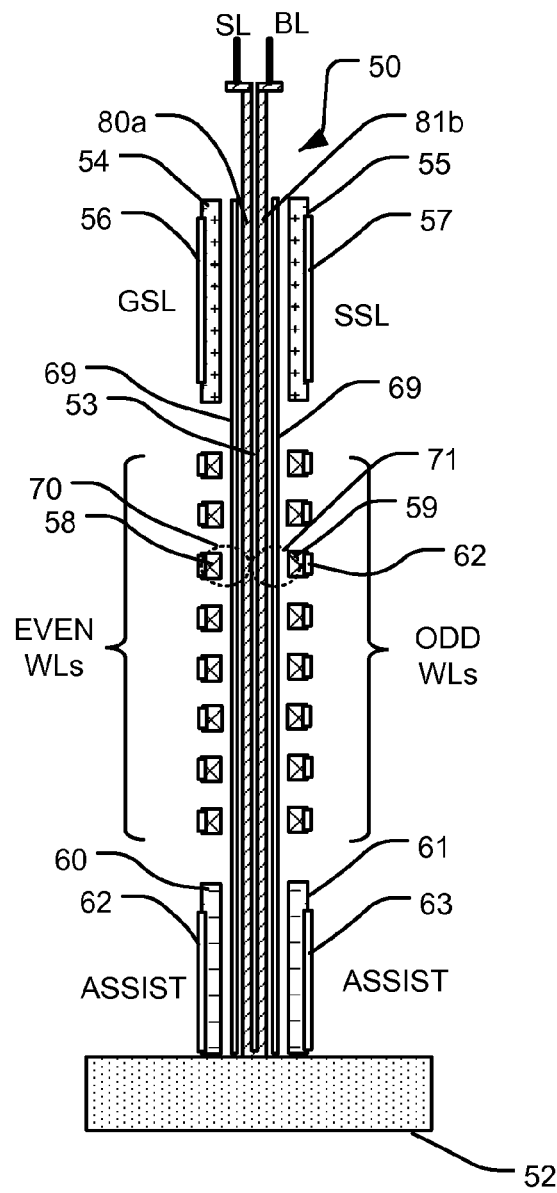
FIG. 3 is a heuristic cross-section of an active pillar with a U-shaped vertical channel film in a 3D memory device.

FIG. 3 is a cross-section of an active pillar which can be used to implement the U-shaped NAND string shown in FIG. 2. The active pillar in FIG. 3 includes vertical channel structure 50, which includes a vertical polysilicon semiconductor body, including even and odd thin channel films separated by a seam 53 along the length of the pillar, and is electrically connected at the bottom of the pillar. Data storage structures 69 are disposed on each side of the pillar. Vertical channel structure 50 includes portion 80a providing a channel body for a ground select line transistor on one side and portion 80b providing a channel body for a string select line transistor on the other side. Between portions 80a, 80b and the bottom of the vertical channel structure, seam 53 is disposed within vertical channel structure 50 between the even and odd word lines. Seam 53 in some embodiments separates the two separate thin-channel bodies at the frustum of the column (e.g. at the level of word lines 58 and 59) at which the word lines cross. Also, seam 53 divides the vertical channel structure into separate thin vertical channels which extend through the GSL and SSL gates.

FIG. 3 illustrates conductive strips configured as a ground select line 54 and a string select line 55, both in the upper level of the stacks of conductive strips. The ground select line 54 and string select line 55 can include more highly conductive film 56, 57 on the outside surfaces, such as a film of a metal silicide.

FIG. 3 also illustrates assist gate lines 60, 61 which can be implemented as conductive strips in the stacks including the word lines. The assist gate lines 60, 61 can include more highly conductive films 62, 63 on the outside surfaces, such as a film of metal silicide.

Likewise, conductive strips are disposed as even and odd word lines on opposing sides of the vertical channel structure 50. Thus, an even word line 59 is disposed opposite an odd word line 58 in the structure. Eight word line layers are illustrated in this example. Of course, a larger number of word line layers, such as 16, 32, or more can be utilized.

As illustrated in FIG. 3, word lines may also include silicide films or other more highly conductive films (e.g. 62) on the outside surfaces.

In other embodiments, all or some of the string select lines, word lines and ground select lines are implemented using metal, or other conductive material, rather than polysilicon.

The structure illustrated in FIG. 3 provides memory cells 70, 71 having independent charge storage sites on the odd and even sides of the vertical channel structure 50. Also, the structure supports operating a single U-shaped NAND string extending along the opposing sides of the vertical channel structure 50.

In the illustration of FIG. 3, the extent in the vertical dimension of the ground select line 54 and the string select line 55 determines the channel length of the ground select transistor and the string select transistor. Likewise, the extent in the vertical dimension of the word lines determines the channel length of the memory cells.

The ground select line 54 and string select line 55 in the structure of FIG. 3 have substantially greater extent in the vertical dimension than the word lines (e.g. 58 and 59), such as more than four times the extent. This greater channel length facilitates operating the string select transistor using a bias voltage on one side of the vertical channel structure which is sufficient to turn off the transistor, even when the bias voltage on the opposite side might otherwise be sufficient to turn it on.

The assist gate lines 60, 61 in the structure illustrated in FIG. 3 also have substantially greater extent in the vertical dimension than the word lines. This facilitates conductivity of the NAND string in the region of the U-turn. The assist gate lines 60, 61 shown in FIG. 3 extend over an insulating layer 52 of a substrate (not shown).

A reference line structure, such as the segment of the reference line (e.g. 2031, 2034 of FIG. 1) in a patterned metal layer, can be arranged over the ground select line (GSL) in the even stacks of conductive strips and connected to the active pillar at the contact SL. A bit line structure, such as the segment of the bit line (e.g. 2060, 2061, 2062 of FIG. 1)

having extensions (e.g. 2045, 2046, 2047 of FIG. 1) in a patterned metal layer, can be arranged orthogonally over the even and odd stacks of conductive strips and connected to the active pillar, through the inter-level connector (e.g. 2035, 2036, 2037 of FIG. 1), at the contact BL.

The active pillar comprises a vertical channel structure including a seam 53 at the intermediate levels, and at the upper level where the string and ground select transistors are disposed. The channels in the memory cells 70 and 71 are thin films of semiconductor material separated by a seam which acts as an insulating structure, or acts as part of an insulating structure between the thin films. The seam encloses gas, such as gas from the atmosphere in the chamber during formation, which can be called "air" for the purposes of this description.

Figure 4:
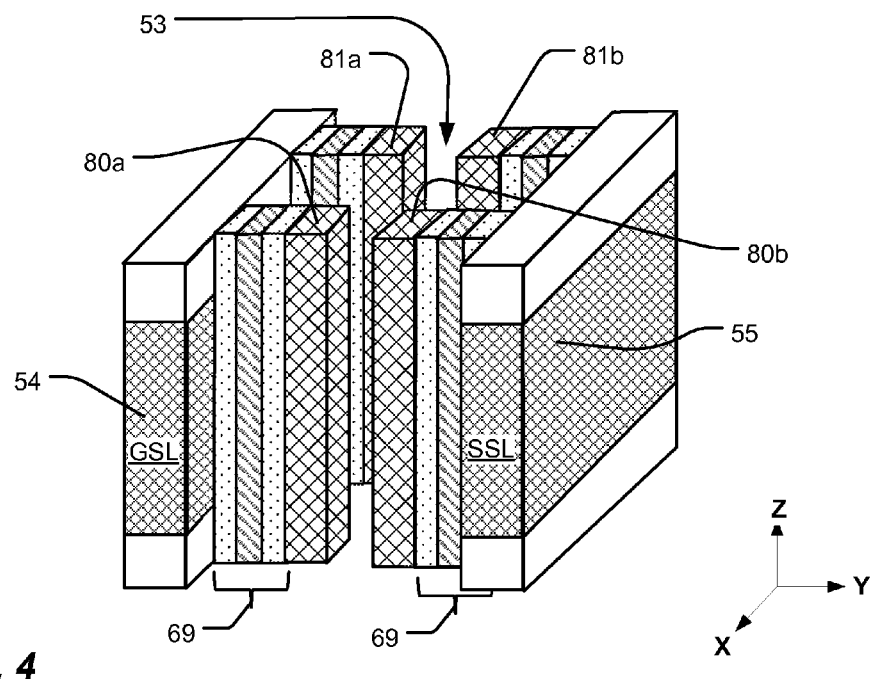
FIG. 4 is a perspective view of the top section of an active pillar in a 3D memory device.

FIG. 4 illustrates a top section of an active pillar in the region of GSL 54 and SSL 55. In the illustration, an active pillar including vertical channel films 80*a*/80*b* and another active pillar including vertical channel films 81*a*/81*b* are shown. Data storage structures 69, formed on opposing sides, extend between a left side (even) GSL 54 and a right side (odd) SSL 55 and act as gate dielectric layers. In the frustum of each active pillar that is between the GSL and the SSL, a string select transistor and a ground select transistor are implemented.

In this illustration, seam 53 is implemented between the active pillar including vertical channel films 80*a*/80*b* and the active pillar including vertical channel films 81*a*/81*b*. This can reduce capacitive coupling between the vertical channel films in the active pillars. In other embodiments, seam 53 can be filled with a solid insulator, such as silicon oxide, low-K dielectric materials or other suitable insulators.

Figure 5:
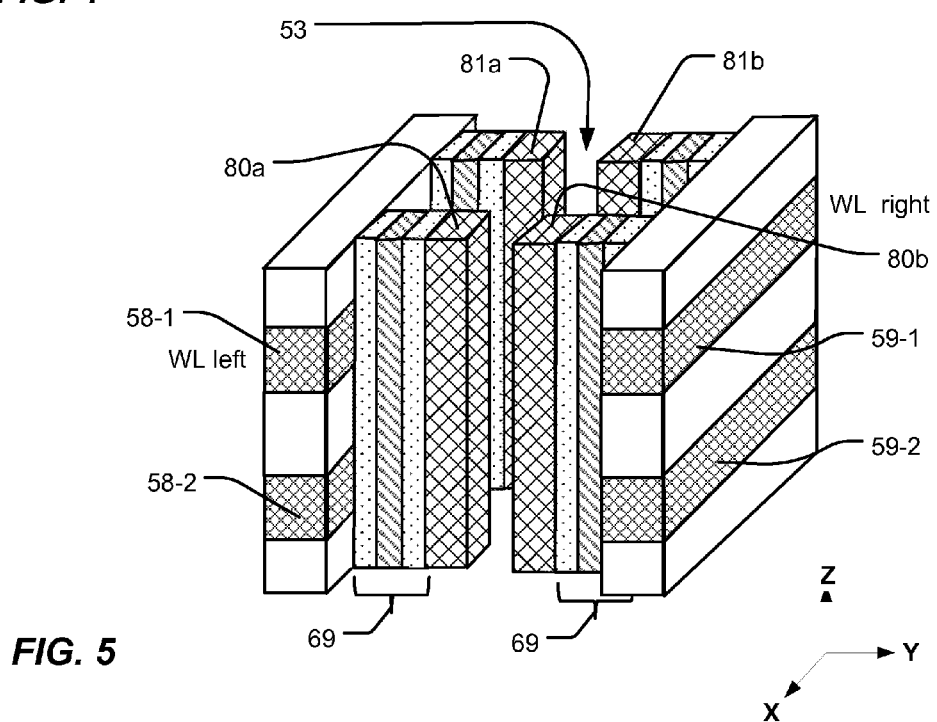
FIG. 5 is a perspective view of two frustums of an active pillar having thin-channel film structures separated by a seam, with memory cells for an active pillar in a 3D memory device.

FIG. 5 illustrates an intermediate section of an active pillar including vertical channel films 80*a*/80*b*, and another active pillar including vertical channel films 81*a*/81*b*, shown in the region of the word lines. In the illustration, the active pillars have vertical channel structures including even and odd thin channel films split by a seam 53 as discussed above, resulting in a first active pillar portion (vertical channel film 80*a*) formed of thin semiconductor film, and a second active pillar portion (vertical channel film 80*b*) formed of a thin semiconductor film and first active pillar portion (vertical channel film 81*a*) and a second active pillar portion (vertical channel film 81*b*), both of which are formed of a thin semiconductor film. The data storage structures 69 are disposed on sides of the word lines, including even word lines 58-1, 58-2 on the left and odd word lines 59-1, 59-2 on the right.

Figure 6:
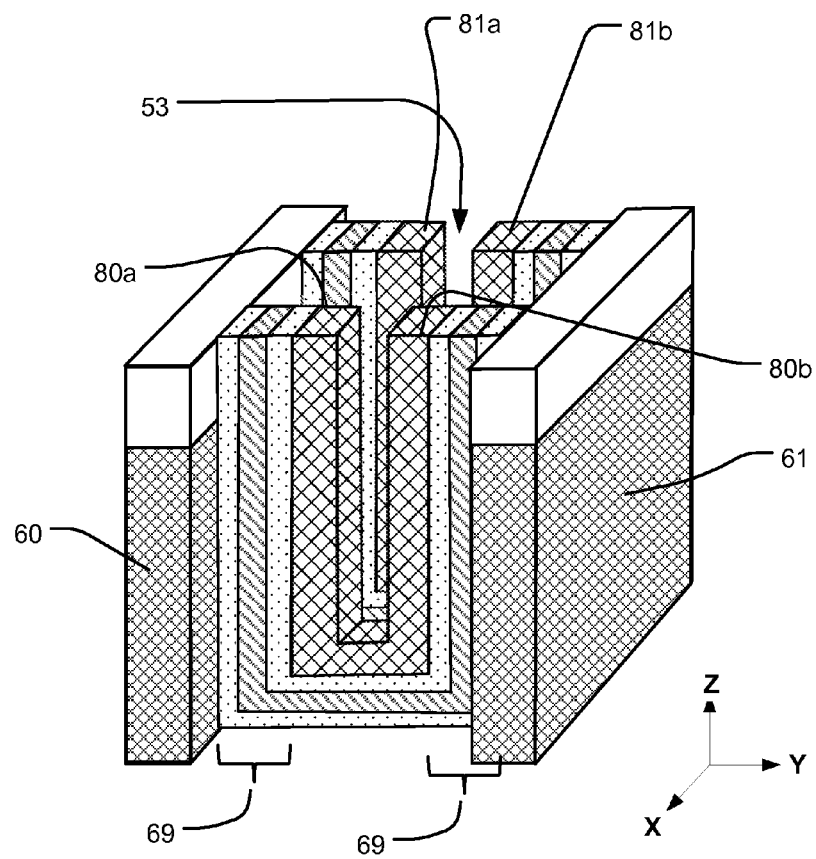
FIG. 6 is a perspective view of the bottom section of an active pillar in a 3D memory device.

FIG. 6 illustrates a bottom section of an active pillar in the region of the assist gates. In the illustration, active pillars including vertical channel films 80*a*/80*b*, 81*a*/81*b* connected at the bottom of the pillar form a U-shaped film so that the vertical channel films are electrically connected. At the crosspoints between the vertical channel films 80*a*/80*b* and the assist gate lines 60, 61 are the assist gates. Data storage structures 69 act as gate dielectric layers of the assist gates. This assist gate can be implemented using a doped region in the substrate beneath the active pillars, or using other techniques.

Figure 7A:
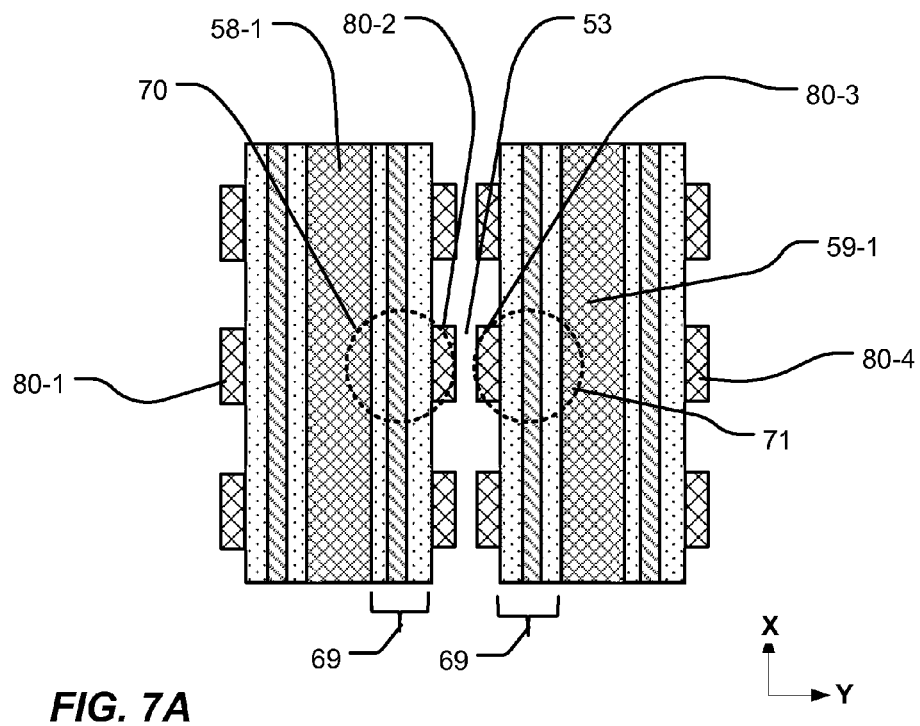
FIG. 7A is a top view of a word line disposed between thin film vertical channel structures which can be used to form a 3D array as described herein.

FIG. 7A is a top view taken at the level of word lines 58-1, 59-1 of FIG. 5, which are conductive strips in first and second stacks of conductive strips. FIG. 7A illustrates the memory cell structure at each frustum of the active pillars. The word line 58-1 is a conductive strip in a stack of conductive strips. The stack of conductive strips has a first side and a second side on which data storage structures 69 are disposed. Data storage structures 69 are on the sidewalls of the conductive strips in the stack, on both the first and second sides. Referring to the word line 58-1, a first thin film semiconductor strip 80-1 is disposed vertically in contact with the data storage structure on the first side. Likewise, a second thin film semiconductor strip 80-2 is disposed vertically in contact with the data storage structure 69 on the second side of the word line 58-1. Memory cells in the plurality of memory cells have channels in the thin film semiconductor strips (80-1, 80-2) and gates in the conductive strips that make up the word lines (58-1).

Also shown in FIG. 7A is a word line 59-1, which is a conductive strip in a second stack of conductive strips. The second stack of conductive strips has a first side and a second side on which data storage structures 69 are disposed. The data storage structures (e.g. 69) are on the sidewalls of the conductive strips in the stack, on both the first and second sides.

Referring to the word line 59-1, a third thin film semiconductor strip 80-3 is disposed vertically in contact with the data storage structure on the first side of the word line 59-1. A fourth thin film semiconductor strip 80-4 is disposed vertically in contact with the data storage structure on the second side of the word line 59-1. An insulating structure in this illustration comprises a seam 53, separating the second thin film semiconductor strip 80-2 and the third thin film semiconductor strip 80-3. In some embodiments, the insulating structure can comprise a solid insulator, such as silicon dioxide, or a combination of a solid insulator and a seam. Note that in most embodiments, second thin film semiconductor strip 80-2 and third thin film semiconductor strip 80-3 are two sides of a continuous U-shaped strip of semiconductor such as polysilicon, connected at the bottom.

Figure 7B:
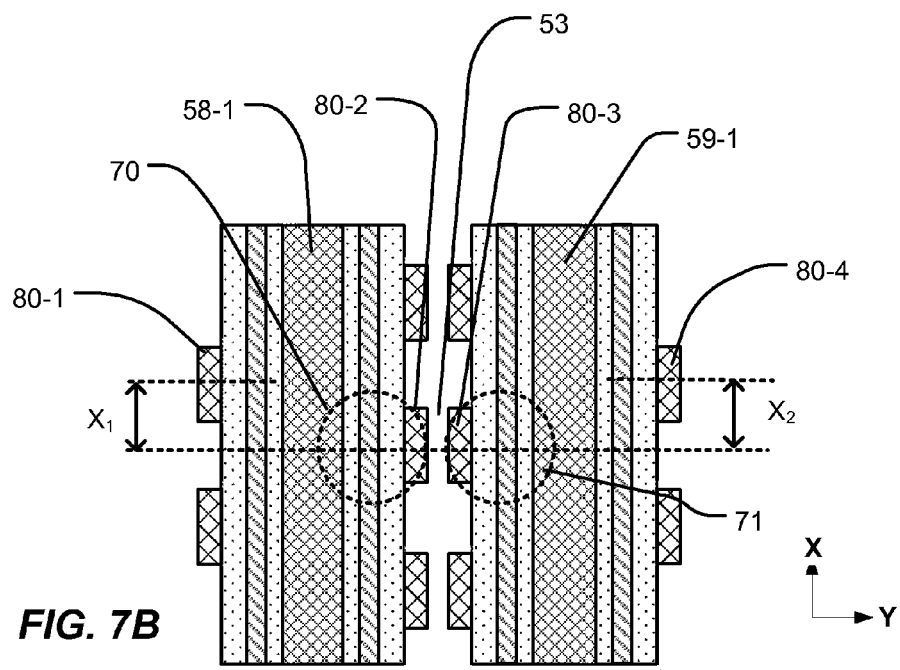
FIG. 7B is a top view of a word line disposed between thin film vertical channel structures in a twisted arrangement.

FIG. 7B illustrates another embodiment for the array layout as discussed below with reference to FIG. 12. Reference numerals used in FIG. 7A are generally applied in FIG. 7B and not described again. The difference between FIGS. 7A and 7B is the arrangement of the thin film semiconductor strips, i.e. the active pillar arrangement. As illustrated in FIG. 7B, the active pillars are laid out in a "twisted" or "honeycomb" arrangement as opposed to the "square" arrangement shown in FIG. 7A.

The thin film semiconductor strips (e.g. 80-2, 80-3) between the word lines 58-1 and 59-1 are opposed to each other and connected at the ends to form the U-shaped film. The thin film semiconductor strips (e.g. 80-1, 80-2) on the first and second sides of the word line 58-1 are offset in x direction by $X_1$ distance, and the thin film semiconductor strips (e.g. 80-3, 80-4) on the first and second sides of the word line 59-1 are offset in x direction by $X_2$ distance. In this illustrated example, $X_1$ is the same as $X_2$. In another example, $X_1$ can be different from $X_2$.

Figure 8:
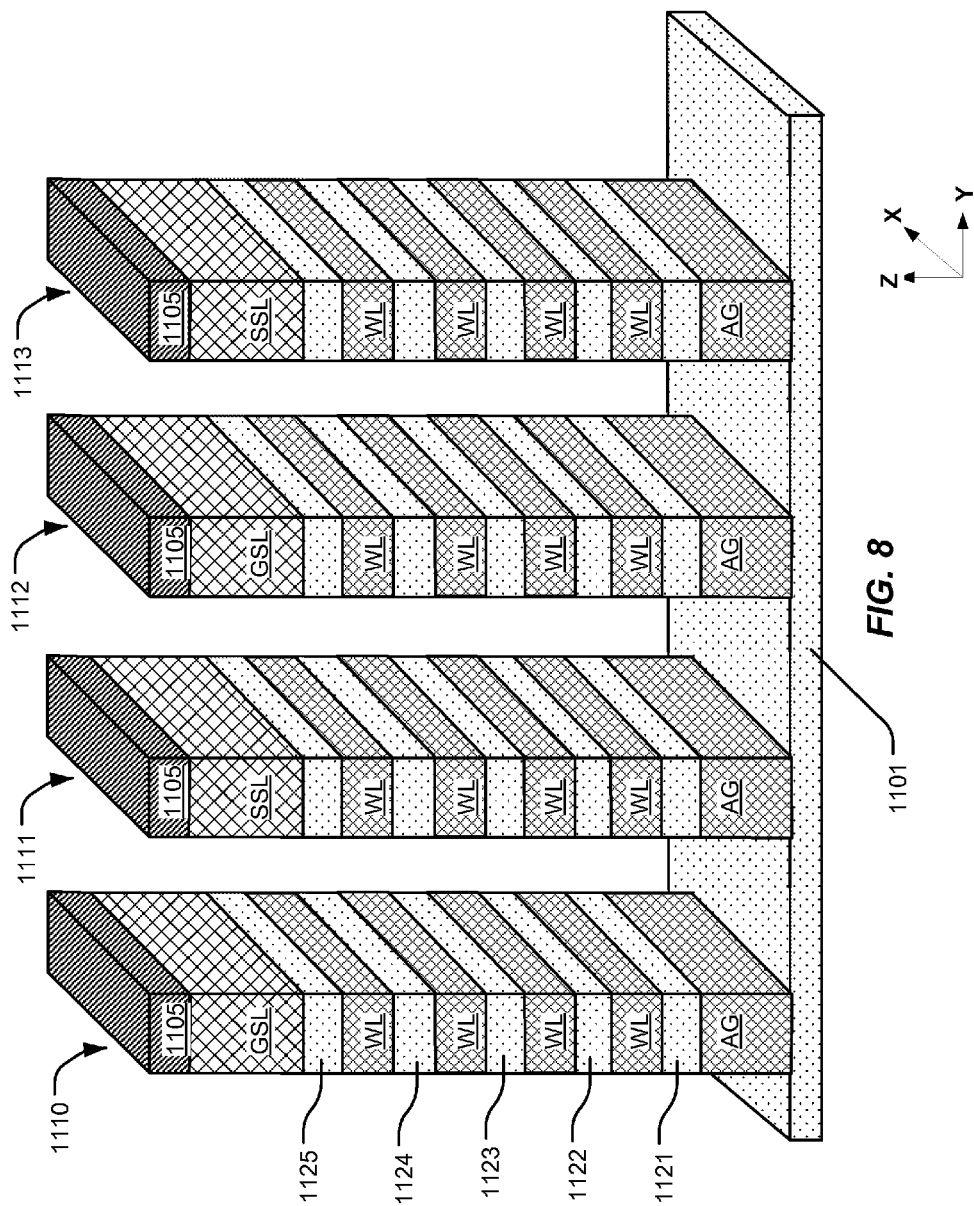
FIGS. 8-16 are perspective views illustrating structures during manufacturing stages for a 3D NAND memory as described herein.

FIGS. 8 through 18 illustrate an example process flow for a vertical thin-channel film structure. FIG. 8 illustrates a stage of the process flow after forming insulating layer 1101 which can comprise a silicon oxide or other dielectric on a semiconductor substrate.

To form the structure shown in FIG. 8, a layer of material suitable for assist gates is deposited over insulating layer 1101, followed by depositing an insulating layer, followed by depositing a stack of alternating layers of material suitable for word lines and insulating material, and followed by depositing a material suitable for GSLs and SSLs.

The assist gate, word lines, GSLs, and SSLs can be formed using the same conductive material. In the embodiments described herein, the conductive material can be a heavily p-type doped polysilicon (P+ polysilicon) or other material selected for compatibility with the data storage structure. A layer of silicon nitride, top layer 1105, which can be used to provide tensile stress, is deposited over the plurality of layers in this example. This layer can improve the uniformity of the stacks and reduce bending, when they are etched with high aspect ratios and narrow lines. The layers of insulating material can comprise silicon dioxide deposited in a variety of ways as known in the art. Also, the layers of insulating material can comprise other insulating materials, and combinations of insulating materials. In this example, all of the insulating layers, with the exception of top layer 1105, consist of the same material. In other examples, different materials can be used in different layers as suits a particular design goal. After the plurality of layers is formed, a patterned etch is applied to form a plurality of stacks of conductive strips.

In yet another example, the assist gate can be implemented using a doped region in the substrate beneath the active pillars, or using other techniques.

FIG. 8 illustrates a stage of the process after etching the plurality of layers, and stopping at insulating layer 1101, to define a plurality of stacks of conductive strips, including stacks 1110, 1111, 1112 and 1113. Stacks 1110, 1111, 1112 and 1113 include at least a bottom level of conductive strips (assist gate, AG), a plurality of intermediate levels of conductive strips (WLs), and a top level of conductive strips (SSL/GLS). The plurality of intermediate levels can include N levels, ranging from 0 to N−1 for the stack. Top layer 1105 of silicon nitride is disposed on each stack. Stacks 1110, 1111, 1112 and 1113 include layers of insulating material 1121, 1122, 1123, 1124, 1125 as labeled in stack 1110, separating the conductive strips from one another.

Figure 9:
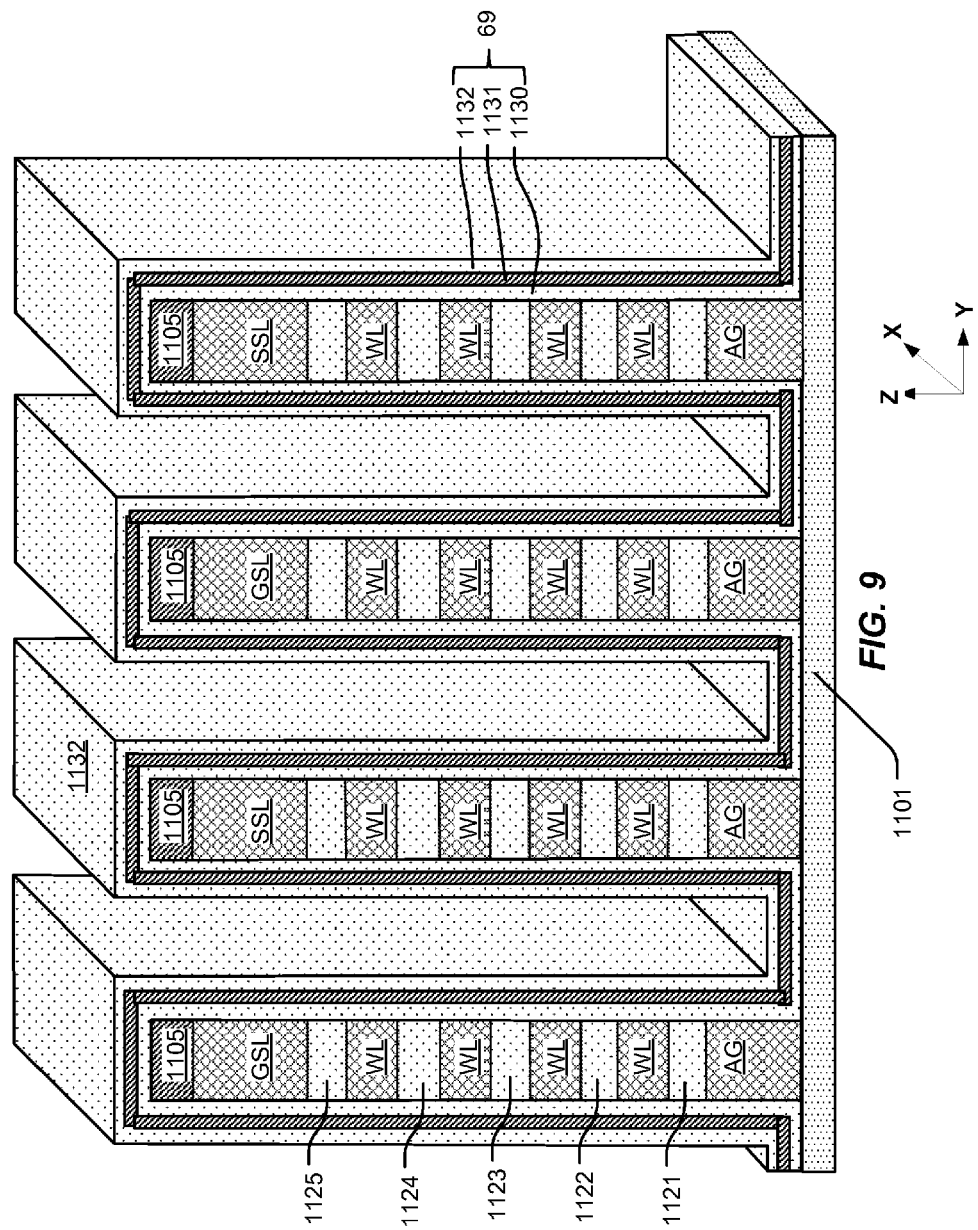

FIG. 9 illustrates a stage of the process flow after forming data storage structures 69 over and on sides of conductive strips in the plurality of stacks and contacting side surfaces of the plurality of conductive strips. Data storage structures 69 can comprise a tunneling layer 1132, a charge storage layer 1131, and a blocking layer 1130.

Tunneling layer 1132 comprises silicon dioxide having a thickness of about 20 Å to 60 Å, for example, about 40 Å formed using LPCVD. Other tunneling materials and structures may be employed, for example, composite tunneling structure.

The composite tunneling structure comprises a layer of silicon dioxide less than 2 nm thick, a layer of silicon nitride less than 3 nm thick, and a layer of silicon dioxide less than 4 nm thick. In one embodiment, the composite tunneling structure consists of an ultrathin silicon oxide layer $O_1$ (e.g. ≤15 Å), an ultrathin silicon nitride layer $N_1$ (e.g. ≤30 Å) and an ultrathin silicon oxide layer $O_2$ (e.g. ≤35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using, for example, low-pressure chemical vapor deposition (LPCVD).

Charge trapping layer 1131 comprises silicon nitride having a thickness of about 40 Å to 90 Å, for example, about 70 Å formed using LPCVD. Other charge trapping materials and structures may be employed, including, for example, silicon oxynitride ($Si_xO_yN_z$), silicon-rich nitride, silicon-rich oxide, trapping layers including embedded nano-particles and so on.

Blocking layer 1130 comprises a layer of silicon dioxide having a thickness of about 50 Å to 130 Å, for example, about 90 Å formed by LPCVD or other wet conversion from the nitride by a wet furnace oxidation process. Other blocking dielectrics can include high-κ materials like aluminum oxide of 150 Å.

The deposition techniques applied to form the multilayer data storage structure 69 can be carried out by conventional LPCVD processes. On the other hand, atomic layer deposition (ALD) or other suitable tools can be utilized for these films. The gate dielectric layer in the regions of the SSL and GSL layers can have a different composition than the data storage structure.

Data storage structure 69 described above can be known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

In yet another example, data storage structure 69 can be implemented to have an improved dielectric charge trapping structure as illustrated below with reference to FIG. 25 and as described in the co-pending and commonly owned U.S. patent application Ser. No. 14/309,622, entitled BANDGAP-ENGINEERED MEMORY WITH MULTIPLE CHARGE TRAPPING LAYERS STORING CHARGE, filed on 19 Jun. 2014, by H. T. Lue, which application is incorporated by reference as if fully set forth herein.

Figure 10:
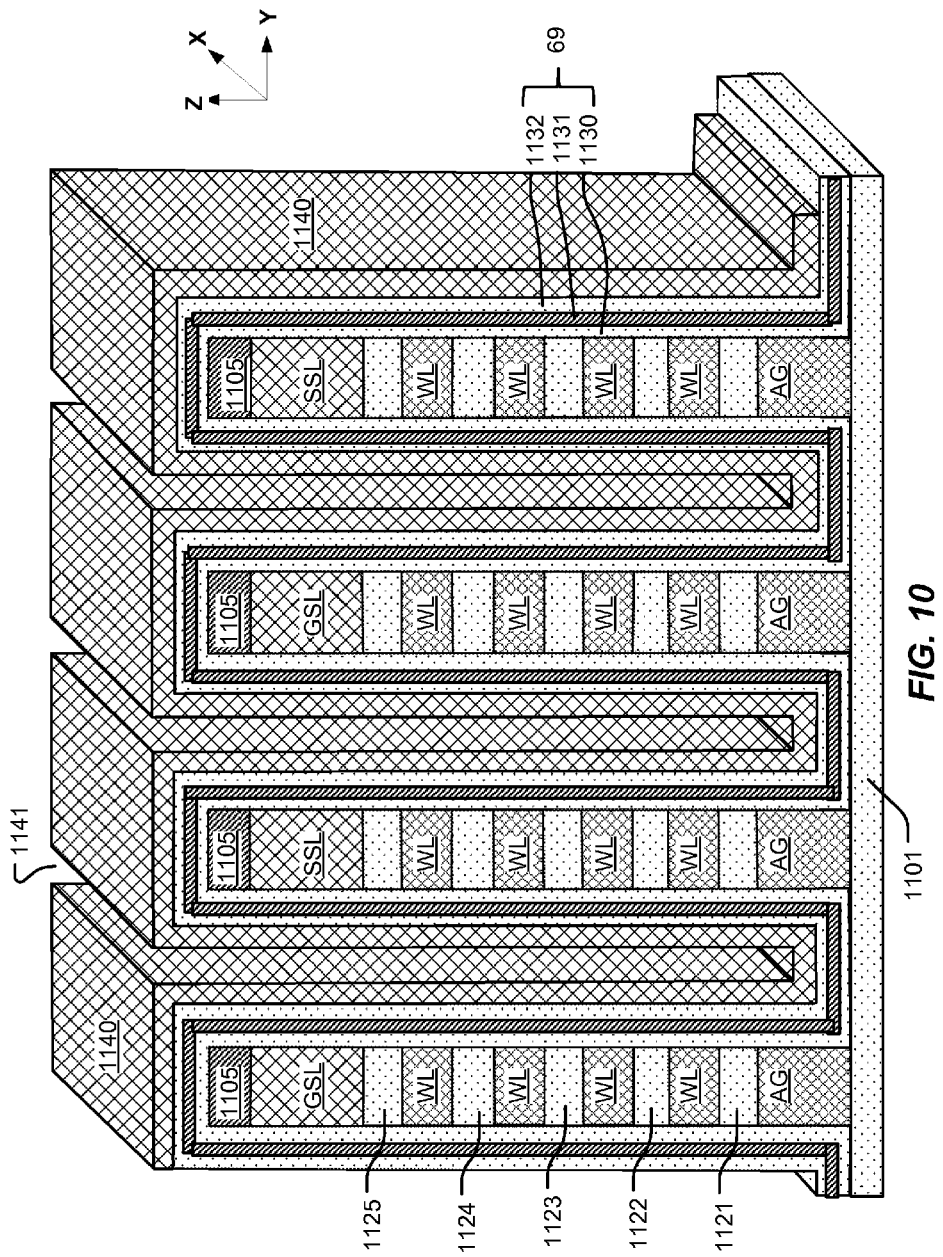

FIG. 10 illustrates a stage of the process flow after forming thin layer 1140 of a semiconductor material over, and having a surface conformal with, the memory layer on the plurality of stacks. In the dielectric charge storage embodiment, thin layer 1140 contacts tunneling layer 1132 at least in the regions in which memory cells are being formed. The semiconductor material in layer 1140 comprises a semiconductor adapted by choice of material, e.g. silicon, and doping concentrations, e.g. undoped or lightly doped, to act as channel regions for vertical strings of memory cells, at least in the regions between the stacks. Thin layer 1140 can have a thickness of about 10 nanometers or less. As illustrated, in the regions (e.g. 1141) between the stacks, thin layer 1140 extends to the bottom of regions 1141 between the stacks, and overlies tunneling layer 1132, charge storage layer 1131, blocking layer 132, and insulating layer 1101. A thin layer of oxide (not shown) can be formed by a short oxidation of layer 1140.

Figure 11:
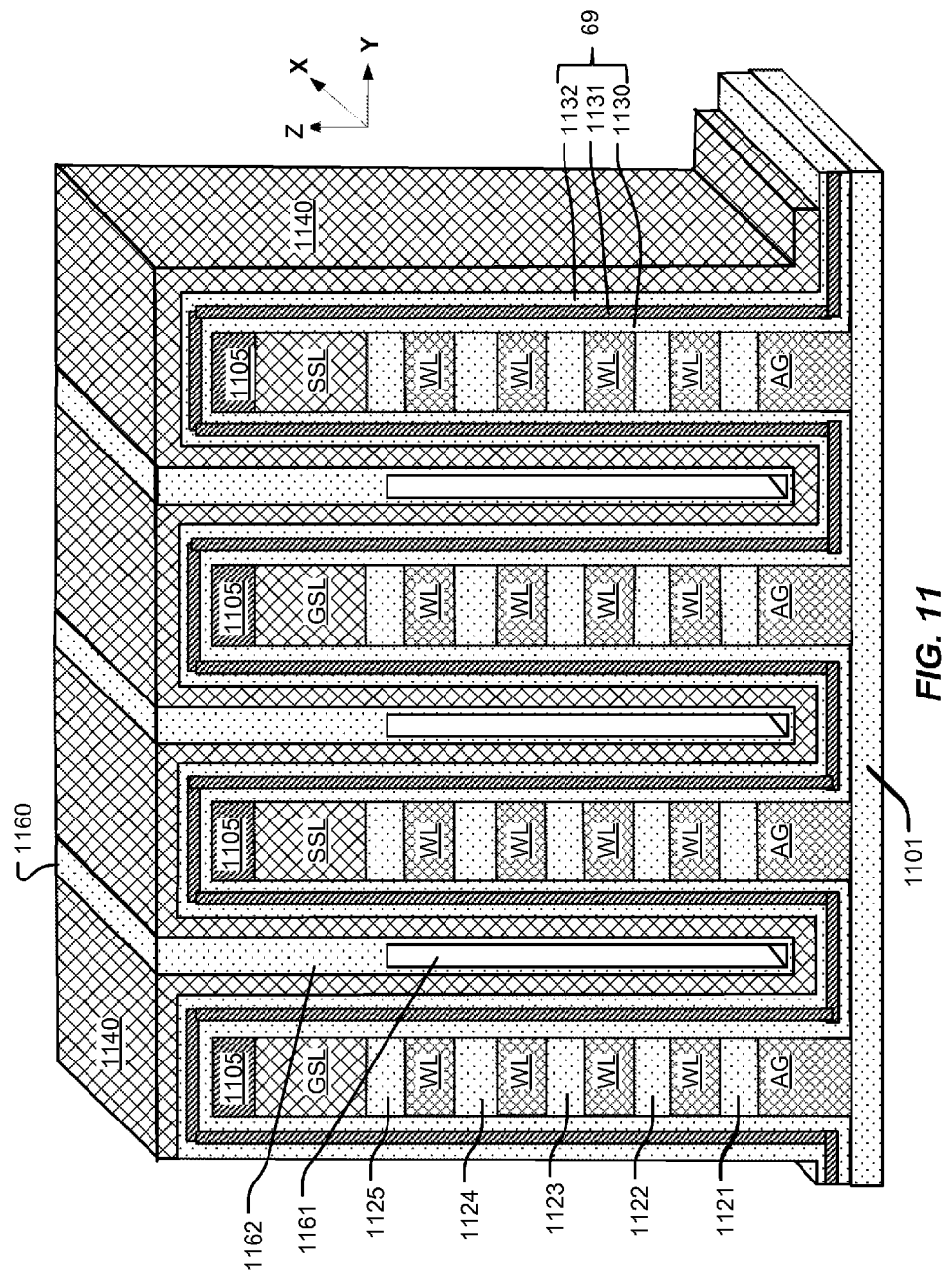

FIG. 11 illustrates a stage in the process flow after performing a step to fill the regions (e.g. 1141 of FIG. 10) between stacks on the inside surfaces of thin film semiconductor layer 1140 with an insulating material. The overhangs may be formed on the top of the inside surface of the thin film semiconductor 1140 when the fill step is applied. Seams or voids 1161 may be formed when two adjacent overhangs are very close or connected together such that the regions between the stacks cannot be completely filled by the insulating material. After the fill step, an etch back or planarizing step such as chemical mechanical polishing can be applied to expose the top surface of thin film semiconductor layer 1140. In the illustrated example, fill structure 1160 includes seams (e.g. 1161) in the regions adjacent the conductive strips in the intermediate and bottom levels, and includes filled portions (e.g. 1162) in the regions adjacent the conductive strips in the top level. The seam 1161 encloses gas, such as gas from the atmosphere in the chamber during formation, which can be called "air" for the purposes of this description.

In another example, the insulating material can completely fill the regions so that the fill structure 1160 is filled with a solid insulator, such as silicon oxide, low-K dielectric materials or other suitable insulators between the stacks.

In yet another example, the seams may extend to the top of the regions between the stacks.

The fill structure 1160 including either seams or solid insulators can reduce capacitive coupling between the opposing sidewalls of thin film semiconductor 1140 in the active pillars.

Figure 12:
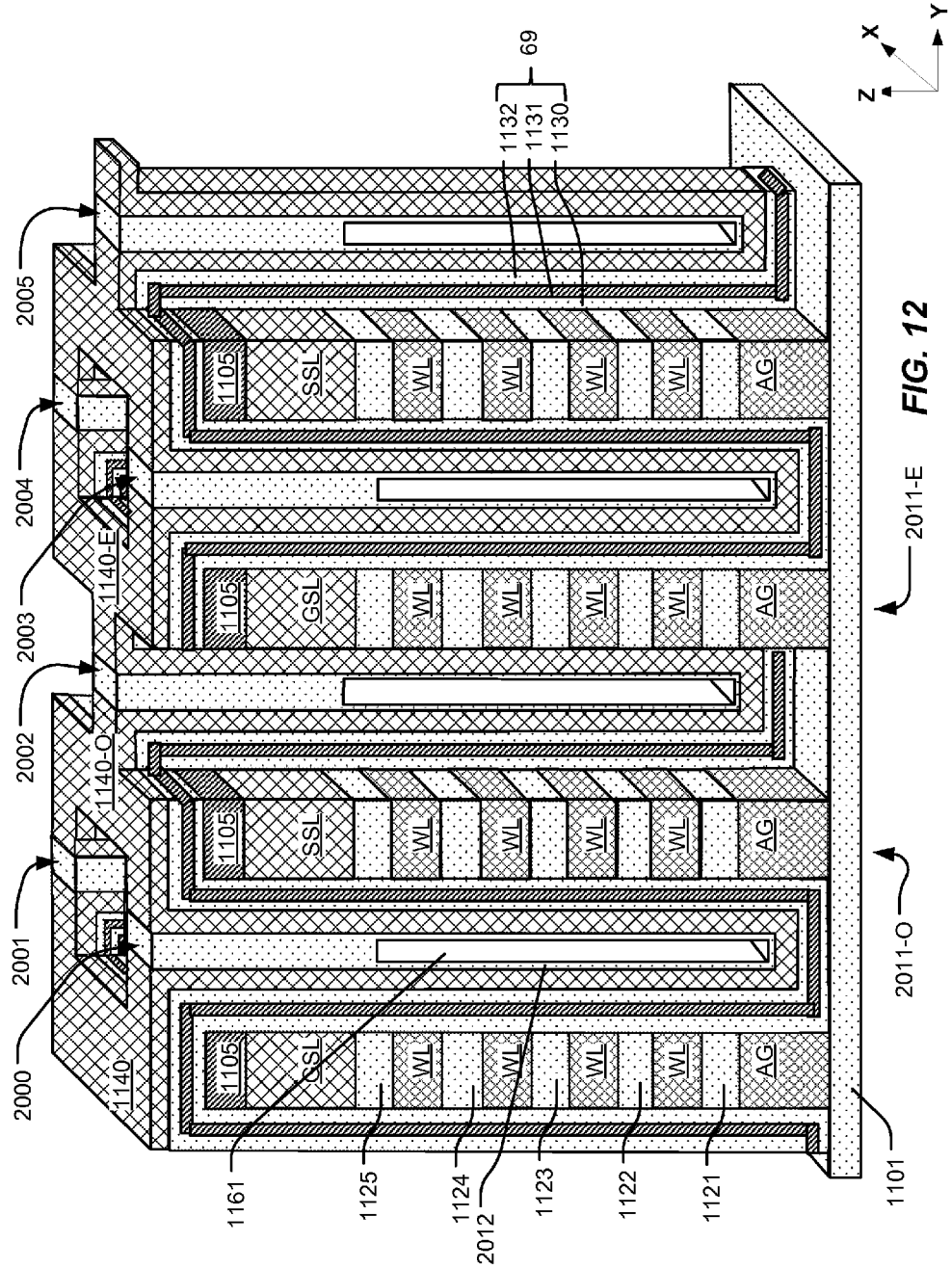

FIG. 12 illustrates a stage in the process after applying a pillar cut etch which includes etching holes between the stacks through the thin film semiconductor layers to form a plurality of insulating structures (2000, 2001, 2002, 2003, 2004, 2005). The holes extend in this example to expose insulating layer 1101. As a result of the hole etch, the vertical channel structures are formed, which are disposed between the even stacks (e.g. 2011-E) and odd stacks (e.g. 2011-O). Insulating structure 2002 is disposed between stack 2011-E and stack 2011-O in this example. The vertical channel structures comprise even and odd semiconductor films that act as vertical channel films, having outside surfaces and inside surfaces. The outside surfaces are disposed on and contact the data storage structures on the sidewalls of the corresponding even and odd stacks forming a 3D array of memory cells. The inside surfaces are separated by an insulating structure (e.g. 2000), which in this example includes a layer of insulating material (e.g. 2012) and a seam (e.g. 1161). The even and odd semiconductor films in the vertical channel structures have thicknesses of 10 nm or less.

As illustrated in FIG. 12, the vertical channel structures are laid out in a honeycomb arrangement, so that each row of vertical channel structures is offset in the row direction from adjacent rows. This honeycomb arrangement facilitates formation of overlying bit lines with a tighter pitch. Insulating fill (not shown) is applied in the holes between the vertical channel structures.

After the hole etch, thin film semiconductor layer 1140 is a continuous semiconductor film over the tops of the stacks and connecting to the vertical channel films of the active pillars. In FIG. 12, portion 1140-O of thin film semiconductor layer 1140 overlies odd stack 2011-O and is continuous along the top of stack 2011-O. Portion 1140-O of thin film semiconductor layer 1140 connects the vertical channel films on the left side of insulating structure 2002, the vertical channel films on the right side of insulating structure 2000 and the vertical channel film on the right side of insulating structure 2001. Portion 1140-E of thin film semiconductor layer 1140 overlies even stack 2011-E and is continuous along the top of stack 2011-E. Portion 1140-E of thin film semiconductor layer 1140 connects the vertical channel films on the right side of insulating structure 2002, the vertical channel films on the left side of insulating structure 2003 and the vertical channel film on the left side of insulating structure 2004 in this illustration.

Figure 13:
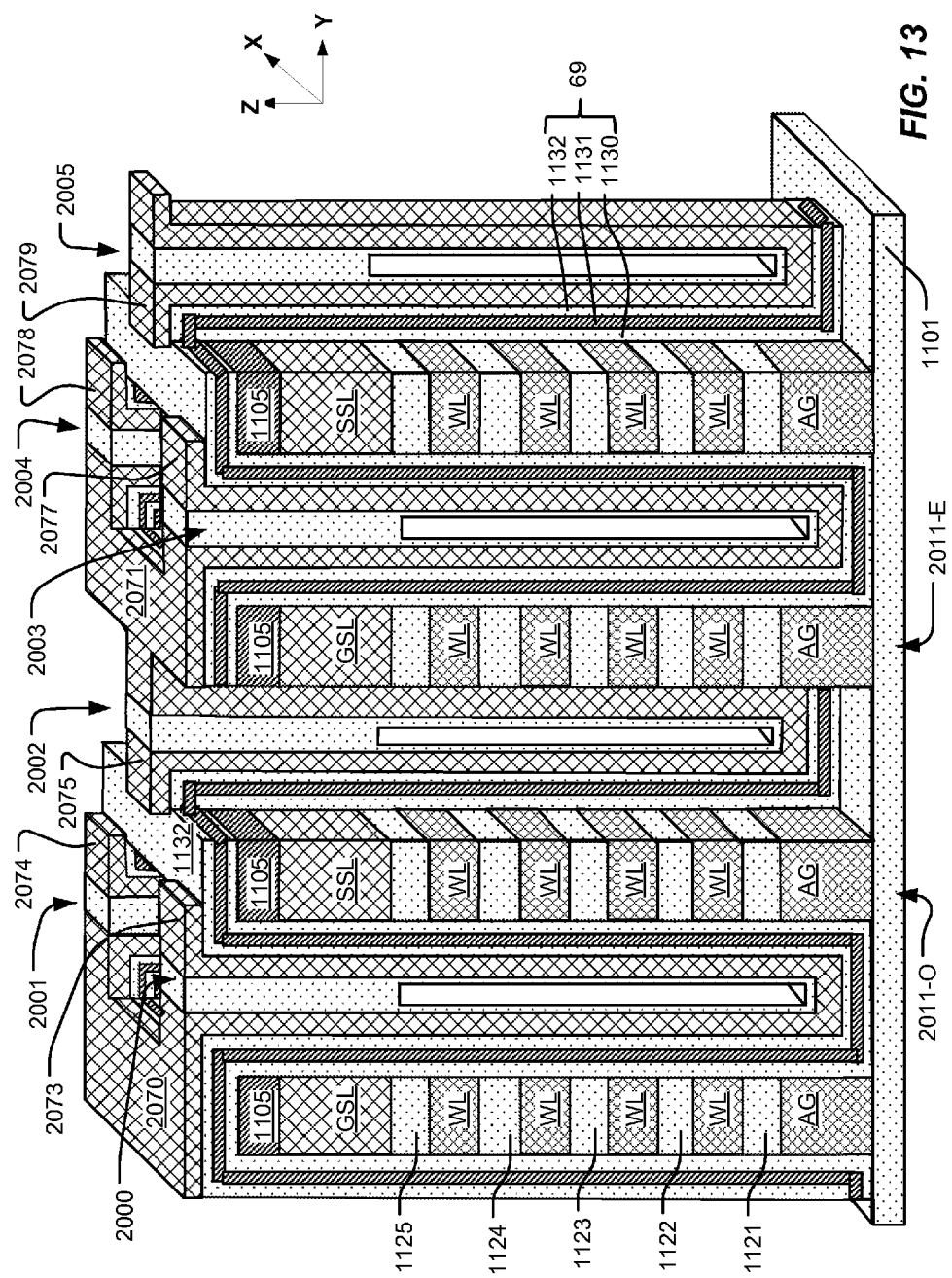

FIG. 13 shows the structure after doing a patterned etch to divide thin film semiconductor layer 1140 remaining over the stacks for the purposes of forming array connections. After the patterned etch, thin film semiconductor layer 1140 is divided into portions 2070 and 2071 which overlie the even stacks, and portions 2073, 2074, 2075, 2077, 2078 and 2079 which overlie the odd stacks. Portions 2070 and 2071 connect the active pillars on the common source sides of the NAND strings together and provide landing areas for interlayer connectors for connection to a common source line. Portions 2073, 2074, 2075, 2077, 2078 and 2079 are separated and provide landing areas for interlayer connectors making independent connection to bit lines. In the illustration, the active pillar on the sides of insulating structure 2005 shows the pattern of the pad on the top of the vertical channel films on the SSL side of the NAND string and on the GSL side of the NAND string; the illustration is incomplete.

Figure 14:
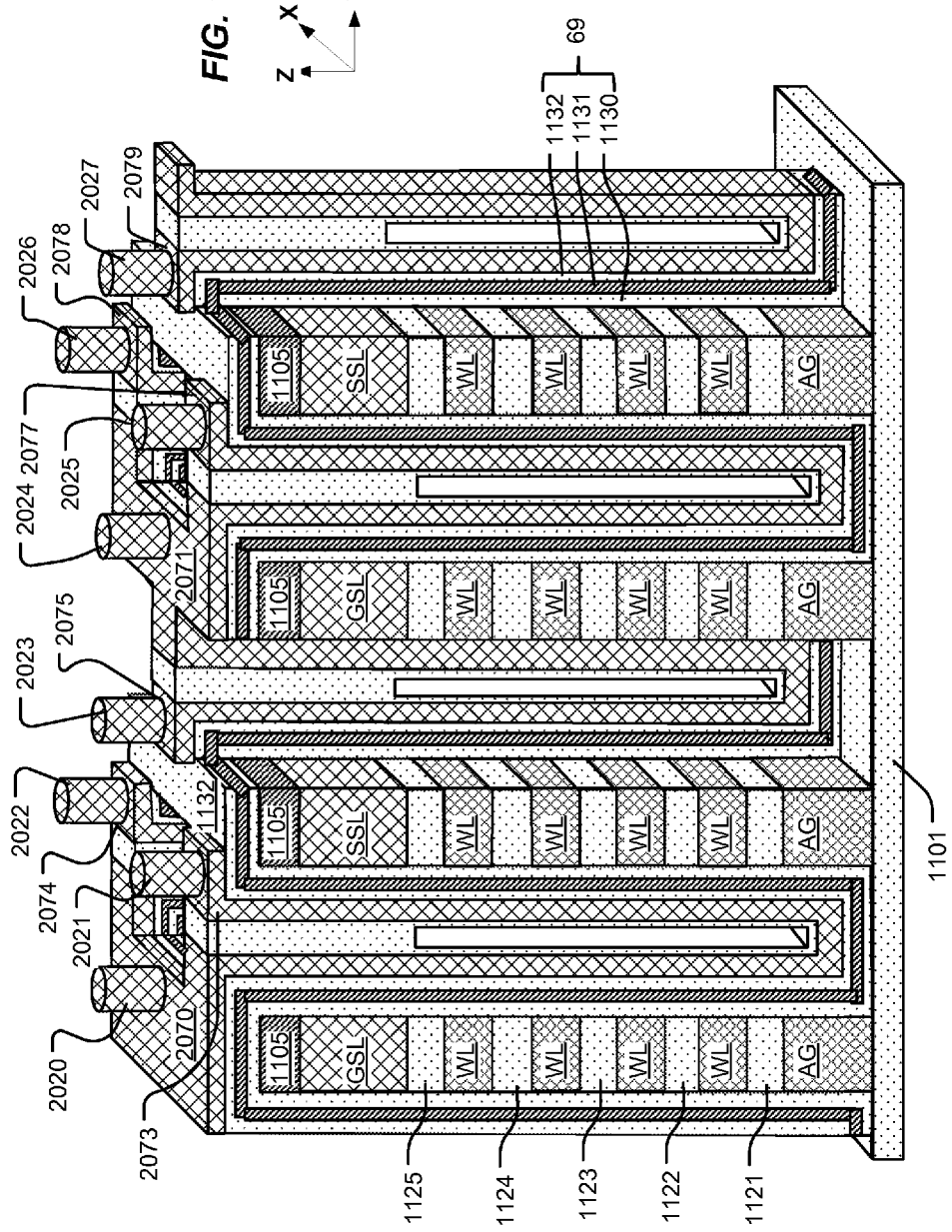

FIG. 14 illustrates the structure of a following stage after formation of an array of interlayer connectors (2020, 2021, 2022, 2023, 2024, 2025, 2026, 2027) through an interlayer dielectric (not shown), landing on corresponding portions of the thin film semiconductor layer. The process can include formation of a layer of interlayer dielectric such as silicon oxide on top of the array, which can be for example about 100 nm to 500 nm thick, followed by formation of openings through the interlayer dielectric exposing the landing areas on the portions of the thin film semiconductor layer. A conductive material compatible with the thin film semiconductor layer is deposited to fill the openings, thereby forming the interlayer connectors. The interlayer connector can comprise a polysilicon plug. Interlayer connectors 2020 and 2024 provide for electrical connection to portions 2070 and 2071 which are continuous with thin-channel films on the GSL sides of the active pillars. Interlayer connectors 2021, 2022, 2023, 2025, 2026, and 2027 provide for electrical connection to portions 2073, 2074, 2075, 2077, 2078, and 2079, respectively, which are portions on the SSL side of the active pillars.

Figure 15:
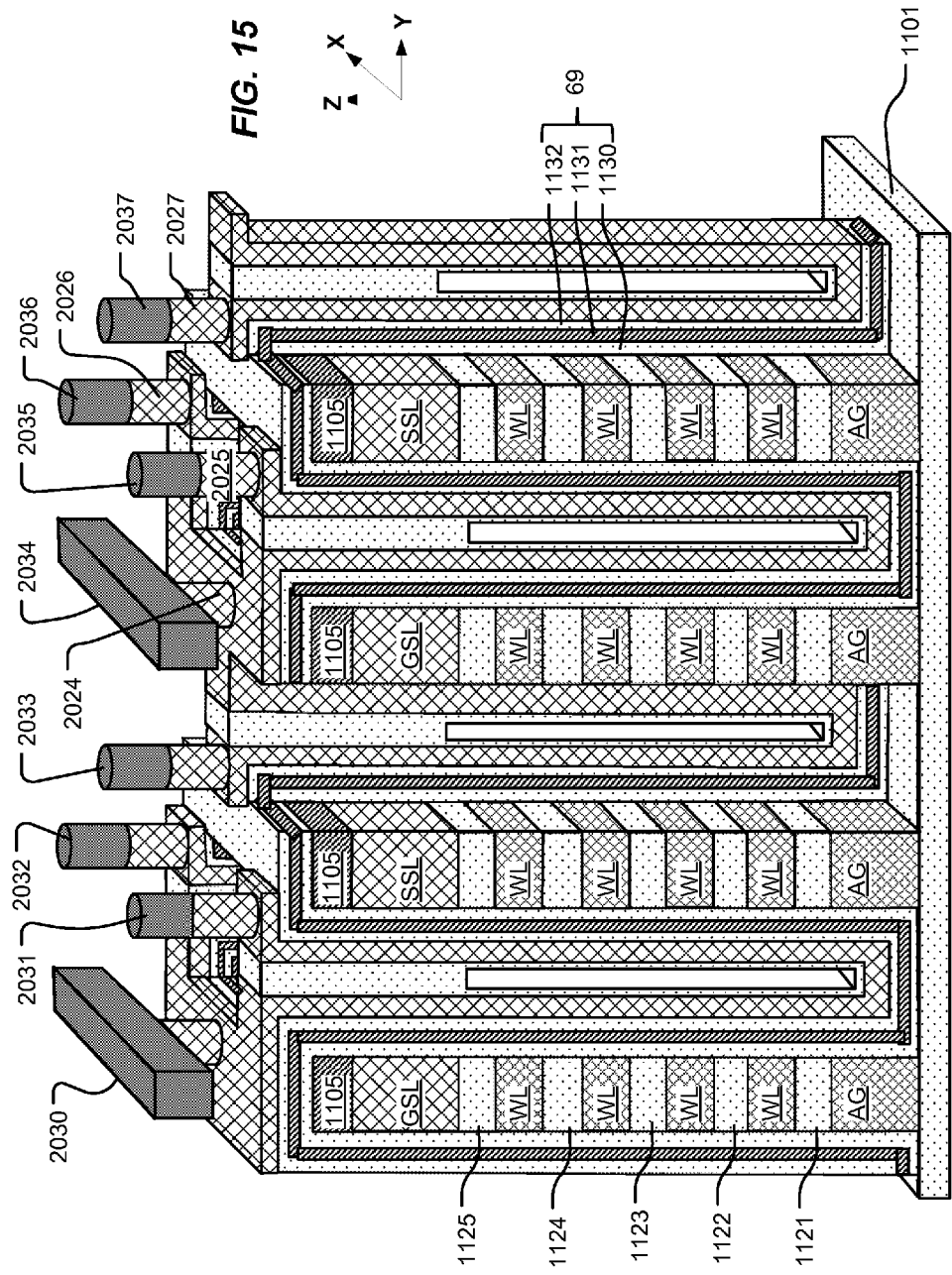

FIG. 15 illustrates the structure after formation of a first level of patterned conductors including reference lines (e.g. 2030, 2034) and inter-level connectors (e.g. 2031, 2032, 2033, 2035, 2036, and 2037). Detailed descriptions are included below with reference to FIGS. 17A-17B. Reference line 2034 makes electrical contact with interlayer connector 2024 and other interlayer connectors (not shown) disposed over the same stack and is connected to the vertical channel films on the GSL sides of NAND strings. As such, reference line 2034 acts as a local common source line and provides connection to a global common source line.

The reference line described herein can be a segment of a reference line, and the segment of the reference line and the inter-level connector are formed in a metal layer first deposited during manufacturing.

Inter-level connectors 2035, 2036 and 2037 are aligned over and make electrical contact with interlayer connectors 2025, 2026 and 2027, respectively, in this example. The inter-level connectors are connected to the vertical channel films on the SSL sides of NAND strings and provide independent connection to the bit lines.

The reference lines and the inter-level connectors can comprise tungsten or other conductive materials such as copper, cobalt silicide, tungsten silicide, other metal materials or combinations thereof, and are formed in the same level.

Figure 16:
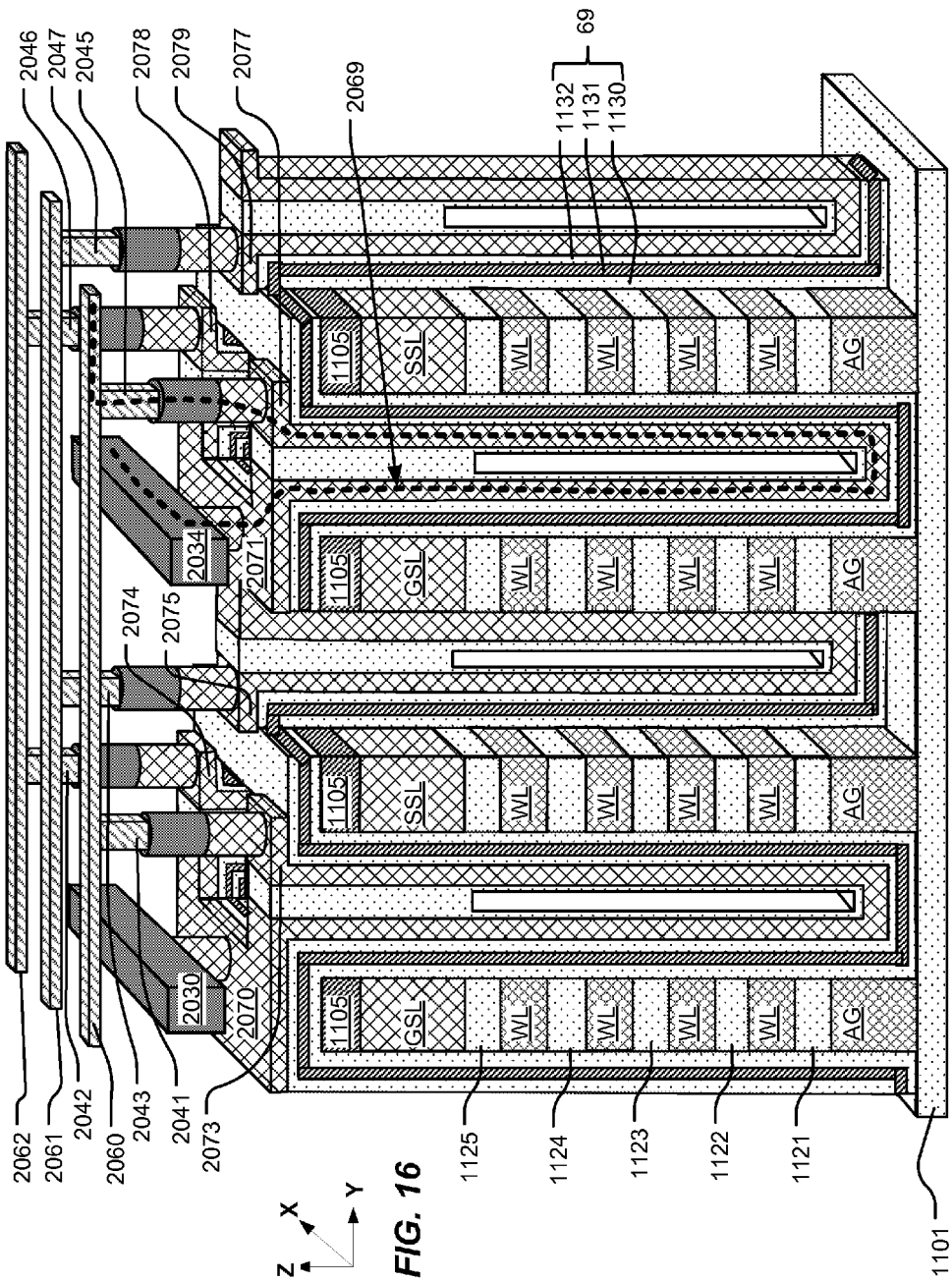

FIG. 16 illustrates the structure after applying a second level of patterned conductors over the first level. The second level of patterned conductors comprises a plurality of bit lines (e.g. 2060, 2061 and 2062), and each bit line in the plurality has at least an extension. The extension is formed in the process of bit line formation and extends downward. The bit line described herein can be a segment of a bit line. For example, bit line 2060 includes extensions 2041 and 2045; bit line 2061 includes extensions 2043 and 2047; and bit line 2062 includes extensions 2042 and 2046. The extension can comprise a fin. The second level of patterned conductors is formed by means of a dual damascene process. Detailed descriptions are included below with reference to FIGS. 18A-21B. As illustrated in FIG. 16, portion 2070 of the thin film semiconductor layer which is connected to the vertical channel films on the GSL sides of NAND strings in active pillars is connected by the interlayer connector (e.g. 2020 of FIG.

14) to reference line 2030 in the first patterned conductor level. Likewise, portion 2071 of the thin film semiconductor layer which is connected to the vertical channel films on the GSL sides of NAND strings in active pillars is connected by the interlayer connector (e.g. 2024 of FIG. 14) to reference line 2034 in the first patterned conductor level. Reference lines 2030 and 2034 connect the plurality of the interlayer connectors along the respective rows and can be operated as common source line. Portions 2073 and 2077 of the thin film semiconductor layer which are connected to the vertical channel films on SSL sides of NAND strings in active pillars are connected through the inter-level connectors to extensions 2041, 2045 of bit line 2060. Portions 2075 and 2079 of the thin film semiconductor layer which are connected to the vertical channel films on SSL sides of NAND strings in active pillars are connected through the inter-level connectors to extensions 2043, 2047 of bit line 2061. Portions 2074 and 2078 of the thin film semiconductor layer which are connected to the vertical channel films on SSL sides of NAND strings in active pillars are connected through the inter-level connectors to extensions 2042, 2046 of bit line 2062.

A circuit path 2069 is shown in FIG. 16 illustrating the current flow for a U-shaped NAND string which is connected between reference line 2034 and bit line 2060. The structure shows a plurality of active pillars between corresponding even and odd stacks of conductive strips. The active pillars comprise semiconductor films having outside surfaces and inside surfaces. The outside surfaces are disposed on the data storage structures on the sidewalls of the corresponding even and odd stacks forming a 3D array of memory cells. The memory cells are connected to form a current path from an upper end to a lower end of the even vertical channel film, and from a lower end to an upper end of the odd vertical channel film.

Figures 17A, 17B:
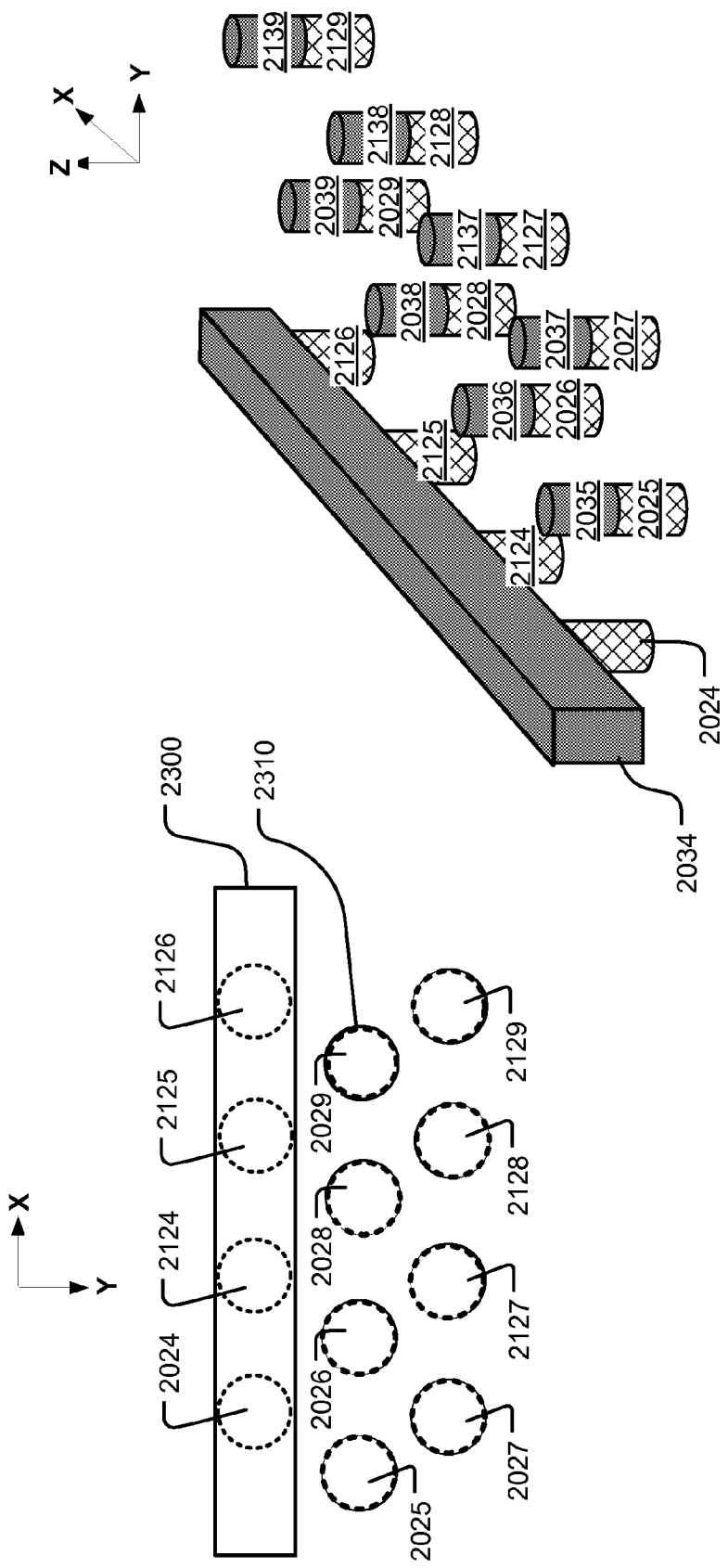
FIG. 17A is a top view showing a partial photoresist mask used to form the first level of patterned conductors illustrated in FIG. 15.
FIG. 17B is a simplified portion of the structure illustrated in FIG. 15.

FIG. 17A is an example top view showing a partial photoresist mask employed in forming the first level of patterned conductors (shown in FIG. 15, which includes reference lines 2030, 2034 and inter-level connectors 2031, 2032, 2033, 2035, 2036, and 2037). The mask has rectangular region 2300 on top of interlayer connectors 2024, 2124-2126, also shown in FIG. 17B, and circular regions 2310 (solid line circle) on top of interlayer connectors 2025-2029, 2127-2129 (dashed line circle, all shown in FIG. 17B). The process can include formation of a layer of interlayer dielectric such as silicon oxide or silicon nitride (not shown) on top of the interlayer connectors, followed by formation of the trenches, corresponding to rectangular regions 2300, and vias, corresponding to circular regions 2310, through the interlayer dielectric exposing the interlayer connectors. In this example, the trenches are formed on the interlayer connectors over the even stacks, and the vias are formed on the rest of the interlayer connectors over the odd stacks. The alignment can be carried out using a borderless silicon nitride process or other technique which provides for good electrical connection to the underlying polysilicon plugs in this embodiment.

A conductive material, such as tungsten, copper, cobalt silicide, tungsten silicide, other metal materials or combinations thereof, is applied to fill the trenches and vias. Followed by a chemical mechanical polish process, reference lines (e.g. 2034) and inter-level connectors (e.g. 2035-2039, 2137-2139) are formed as shown in FIG. 17B and comprised of the same conductive material. The reference line (e.g. 2034) is comprised of the conductive material in a trench through the interlayer dielectric connected to the pad on the even stack. The inter-level connector (e.g. 2035-2039, 2137-2139) is comprised of a plug comprised of the conductive material in a via through the interlayer dielectric connected to the pad on the odd stack. The reference line described herein can be a segment of a reference line. Referring to FIG. 17A and FIG. 15, reference line 2034 can be operated as a local common source line and is coupled to a reference voltage source so that the vertical channel films on the GSL sides of NAND strings is applied a reference voltage. The inter-level connectors connect bit lines to the respective vertical channel films on the SSL sides of NAND strings FIG. 17B is a simplified structure showing only interlayer connectors 2024-2029, 2124-2129, reference line 2034 and inter-level connectors 2035-2039, 2137-2139. Reference line 2034 is formed on top of and in contact with a plurality of interlayer connectors (e.g. 2024, 2124-2126).

FIGS. 18A-21B illustrate intermediate structures in the process flow of formation of the second level of patterned conductors, which is shown in FIG. 16 and includes bit lines 2060-2062 and associated extensions 2041-2013, 2045-2047.

Figures 18A, 18B:
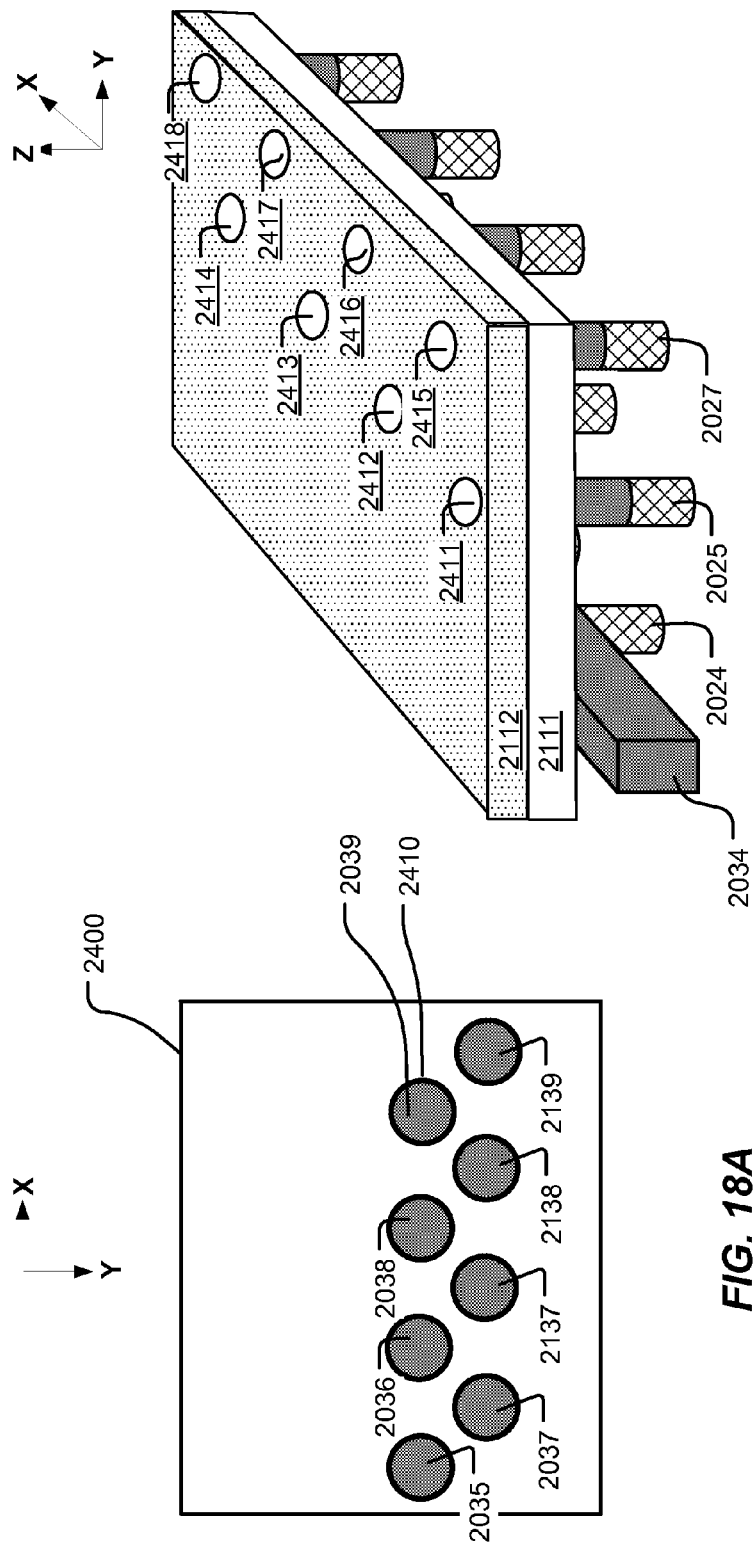

FIG. 18B illustrates the structure of a stage in the process flow after formation of holes in the second insulating film. The process described herein includes depositing first insulting film 2111 and second insulting film on the first level of patterned conductors. FIG. 18A is a top view of a partial photoresist mask used to form holes in second insulating film 2112. In FIG. 18A, mask 2400 includes openings (solid line circle, e.g. 2410) on top of and aligned with inter-level connectors 2035-2039 and 2137-2139 (shaded regions) formed in the previous step and shown in FIG. 17B. In the illustrated example, the area of the openings is substantially the same as that of the inter-level connectors. In another example, the openings can have different areas and different shapes than the tops surfaces of inter-level connectors.

Second insulating film 2112 has an etch selectivity over first insulating film 2111, which means first and second insulating films 2111, 2112 exhibit sufficient difference in etch rates in the same etch conditions. The use of appropriate etchants can etch through second insulating film 2112 only and stop at first insulating film 2111, thereby forming holes 2411-2418 in the second insulating film 2112. First insulating film 2111 functions as an etch stop layer in the process of forming holes in second insulating film 2112. For example, first insulting film 2111 comprises silicon oxide, and second insulting film 2112 comprises silicon nitride. Because silicon nitride has adequate etch selectivity to silicon oxide, it can be controlled to etch away portions of silicon nitride and to stop at silicon oxide. In another example, the first insulating film can be silicon oxide or silicon oxynitride, and the second insulting film can be silicon carbide. Likewise, silicon carbide has adequate etch selectivity to silicon oxide or silicon oxynitride; it can be controlled to etch away portions of silicon carbide and stop at silicon oxide or silicon oxynitride.

FIG. 19A illustrates a top view of a partial photoresist mask for patterning a multilayered insulating structure. As is shown in FIG. 19A, the mask has opening regions (e.g. 2500). Each opening region is aligned with and on top of the respective holes (e.g. 2411-2418) in second insulating film 2112.

FIG. 19B illustrates the structure of a stage in the process flow after patterning the multilayered insulating structure. The process includes formation of third insulating film 2113 disposed over second insulating film 2112 and filling holes 2411-2418 in second insulating film 2112. The third insulating film comprises the same material as the first insulating film so that the second insulating film also has an etch selectivity over the third insulating film. On the other hand, the third insulating film has an etch selectivity over the second insulating film in different etch conditions. The first, second, and third insulating films compose a multilayered insulating structure, in which the second insulating film acts as an etch stop layer in the process of etching the third insulating film and the first insulating film acts as an etch stop layer in the process of etching the second insulating film.

The use of etch reactants capable of etching materials of first and third insulating films 2111 and 2113 and barely etching materials of second insulating film 2112 will remove portions of third insulating film 2113 corresponding to the opening regions 2500 in the mask, thereby forming a plurality of insulator strips (e.g. 2113-1 to 2113-9). Due to the etch selectivity, the etch process will stop at the patterned second insulating film 2112, and further etch away portions of the third insulating film 2113 which filled in the holes in second insulating film 2112 during deposition of third insulating film 2113. The etch process continues etching through the holes in second insulating film 2112 to etch portions of first insulating film 2111, exposing the inter-level connectors (2035-2039, 2137-2139 of FIG. 17B). The shape of the etched portions of first and second insulating films 2111, 2112 is defined by the overlapping area between the open regions (e.g. 2500) and the holes (e.g. 2411-2418) in the second insulating film. The remaining portion of the multilayered insulating structure constitutes a patterned insulating structure.

Figure 20B:
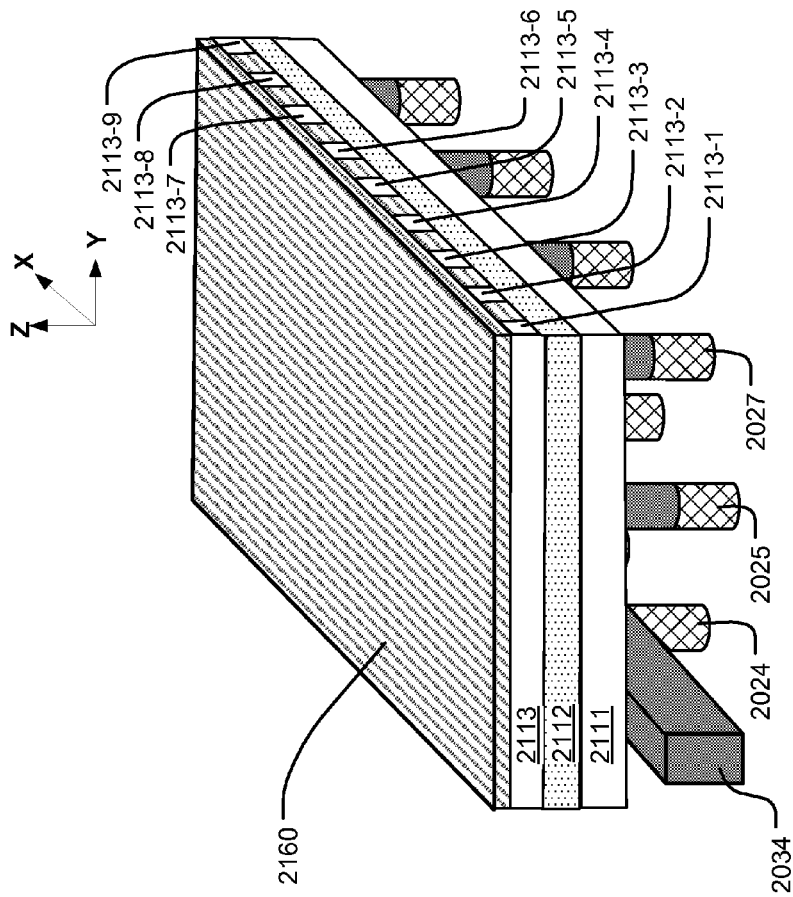
Figure 20A:
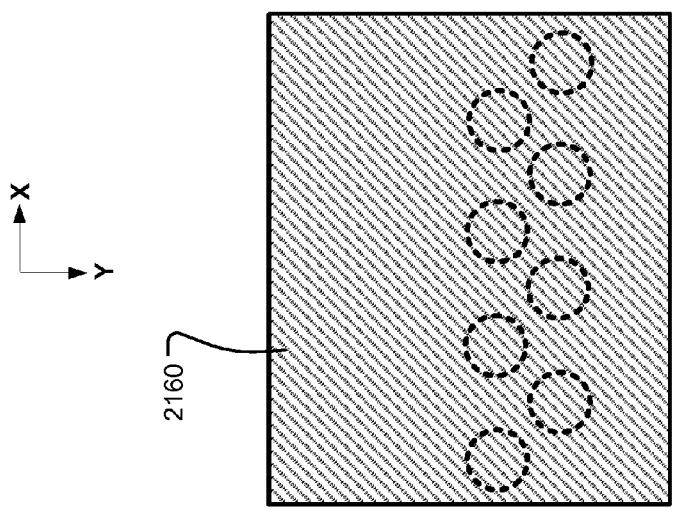

FIGS. 20A and 20B respectively illustrate a top view and a structure of a stage in the process flow after depositing a layer of conductor 2160 over the patterned insulating structure formed in the previous step. Conductor 2160 fills the etched holes in the first and second insulating films, forming a plurality of extensions, and fills the spaces between the plurality of insulator strips (2113-1 to 2113-9), forming a plurality of bit lines. Filling at least two features with a conductor to form a multilayer interconnection in a single step is known as a dual damascene process. The conductor may comprise metal materials, such as copper, tungsten, Ti/TiN, Molybdenum, tungsten silicide, cobalt silicide, aluminum, and combinations thereof.

Figure 21B:
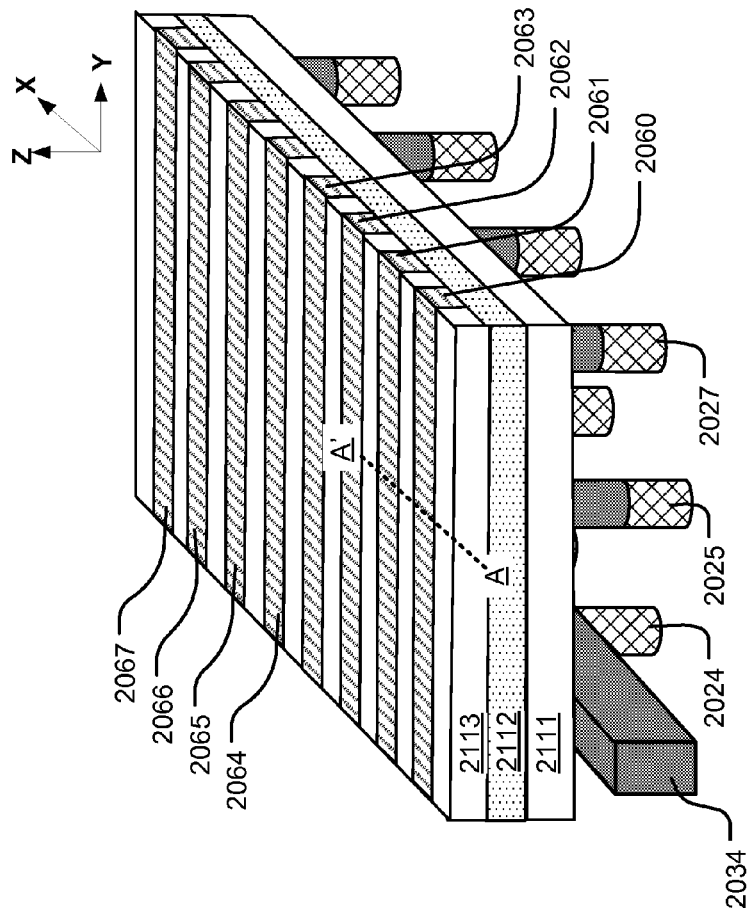
Figure 21A:
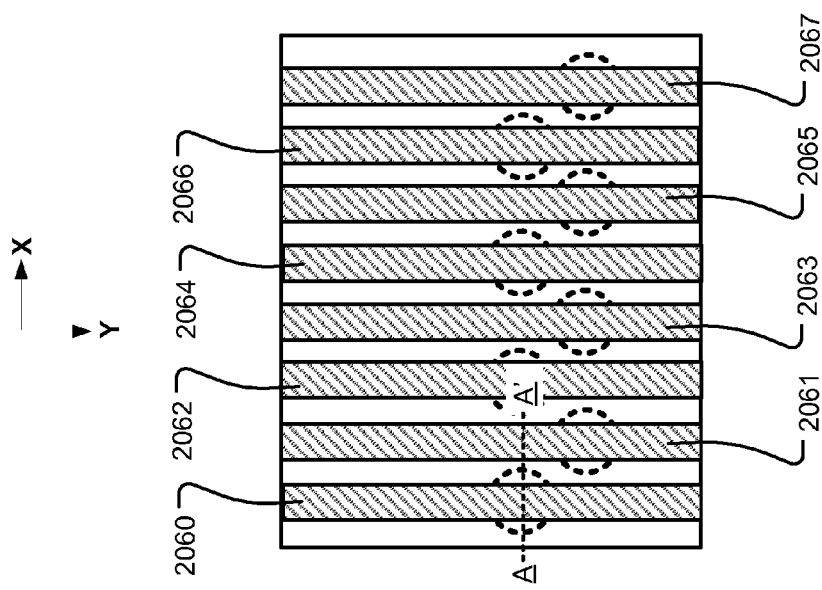

FIGS. 21A and 21B respectively illustrate a top view and a structure of a stage in the process flow after formation of bit lines. The process includes applying a method of chemical mechanical polish on the conductor 2160 until the top surfaces of the plurality of insulator strips (e.g. 2113-1 to 2113-9 shown in FIG. 20B) are exposed, thereby forming the second level of patterned conductors including the bit lines (e.g. 2060-2067) having the extensions as discussed above with reference to FIG. 17. Bit lines 2060-2062 are shown in FIG. 16. The bit line described herein can be a segment of a bit line and the extension can comprise a fin with first and second insulating films.

FIG. 22A is an enlarged cross-section taken in the XY plane through the second insulating film 2112, intersecting extensions (e.g. 2045 and 2047, also shown in FIG. 16) configured as part of bit lines extending downward. The shape of the extensions is determined by the overlapping area between the opening regions (e.g. 2410, also shown in FIG. 18A) in the mask used to pattern the second insulting film 2112 and the opening regions (e.g. 2500, also shown in FIG. 19A) in the mask used to pattern the third insulting film 2113. In the illustrated example, the extension (e.g. 2045 and 2047) has two straight sides (e.g. 2571-2574) aligned with the bit line, and has two curved side (e.g. 2561-2564 defined by the holes in the second insulating film 2112, therefore aligned with the second insulating film 2112. The extension (e.g. 2045, 2047) has opposing sidewalls, at the sides (e.g. 2571/2572, 2573/2574), contacting the third insulating film filled in the hole in the second insulating film, and has other opposing sidewalls, at the sides (e.g. 2561/2562, 2563/2564), contacting the second insulating film.

In yet another example, where the opening regions (e.g. 2410 shown in FIG. 18A) in the mask used to pattern the second insulting film 2112 have a square shape, the extension can have two straight sides aligned with the bit line and two straight sides aligned with the second insulating film.

FIG. 22B is an enlarged perspective view of the bit lines. Bit lines 2060, 2061 (also shown in FIG. 16) have extensions 2045, 2047 connecting inter-level connectors 2035, 2037 in the first patterned conductor level; the bit lines and the associated extensions are in the second patterned conductor level.

FIGS. 23A-23B are an enlarged cross-section taken on line AA' of FIGS. 21A and 21B, with deletion of the interlayer connector. FIG. 23A shows a structure with precise alignment between the mask used to pattern the second insulting film 2112 and the mask used to pattern the third insulting film 2113. Bit line 2060 and associated extension 2045 are fully on top of the inter-level connector 2035. The adjacent bit line (e.g. 2061) stops on second insulting film 2112.

FIG. 23B shows a structure under a misalignment circumstance, second insulating layer 2112 can block the adjacent bit line (e.g. 2061) from contacting inter-level connector 2035 so that the bit line (e.g. 2060) and the adjacent bit line (e.g. 2061) will not contact the same inter-level connector. As such, even if the pitch of the bit line becomes smaller, the resulting structure formed using the dual damascene process can avoid a short between two bit lines 2060, 2061.

FIG. 24 is a structure without the use of the dual damascene process described above to form bit lines with extensions. In the illustration, the misalignment between the bit lines (e.g. 5060, 5061) and the conductors (e.g. 5030) can cause the two bit lines to be connected, resulting in a short which affects the entire memory array; therefore, the memory device will fail to operate. To avoid such failure, one solution, other than the present technology, is to reduce the size of the conductors 5030 so that the juxtaposed bit lines will not be connected by contacting one conductor 5030. This can be achieved by adopting a Self-Aligned Double Patterning process to form the narrow conductors, but it will increase the manufacturing processes and cost. As a result, the present technology provides more tolerance of alignment in the manufacture, with high yield and low cost.

FIG. 16 shows a memory device in which stacks of conductive strips are separated. Referring to the conductive strips in first and second stacks, a configuration for interconnection to the U-shaped NAND strings is described. The first and second stacks of conductive strips have sidewalls opposite each other. The data storage structures are formed on the sidewalls of the first and second stack. The first and second vertical channel films are formed on the data storage structures on the sidewalls of the first and second stack. The first vertical channel film includes a first pad over the first stack on an upper end of the first vertical channel film, and the second vertical channel film includes a second pad over the second stack on an upper end of the second vertical channel film. The first and second vertical channel films are connected at ends.

An upper strip in a first stack is configured as a gate of a first switch, e.g. a GSL switch, having a channel in the first semiconductor film, and an upper strip of a second stack is configured as a gate of a second switch, e.g. an SSL switch having a channel in the second semiconductor film. Intermediate strips in the first and second stacks are configured as word lines. Bottom strips in the first and second stacks are configured as assist gates.

A first level of patterned conductors overlies the first and second stacks, comprising a reference line and an inter-level connector. The reference line is connected to the first pad, and the inter-level connector is connected to the second pad. A second level of patterned conductors is formed over the first level of patterned conductors. The second level of patterned conductors comprises a bit line including an extension contacting the inter-level connector.

Also, additional vertical channel structures disposed between the same first and second stacks are configured so that the first semiconductor films on the first stack are all electrically connected, and can share connection to the same reference line. Furthermore, the additional vertical channel structures between the same first and second stacks are configured so that the second semiconductor films on the second stack are electrically separated, and can be individually connected to separate bit lines using individual inter-level connectors.

Figure 25:
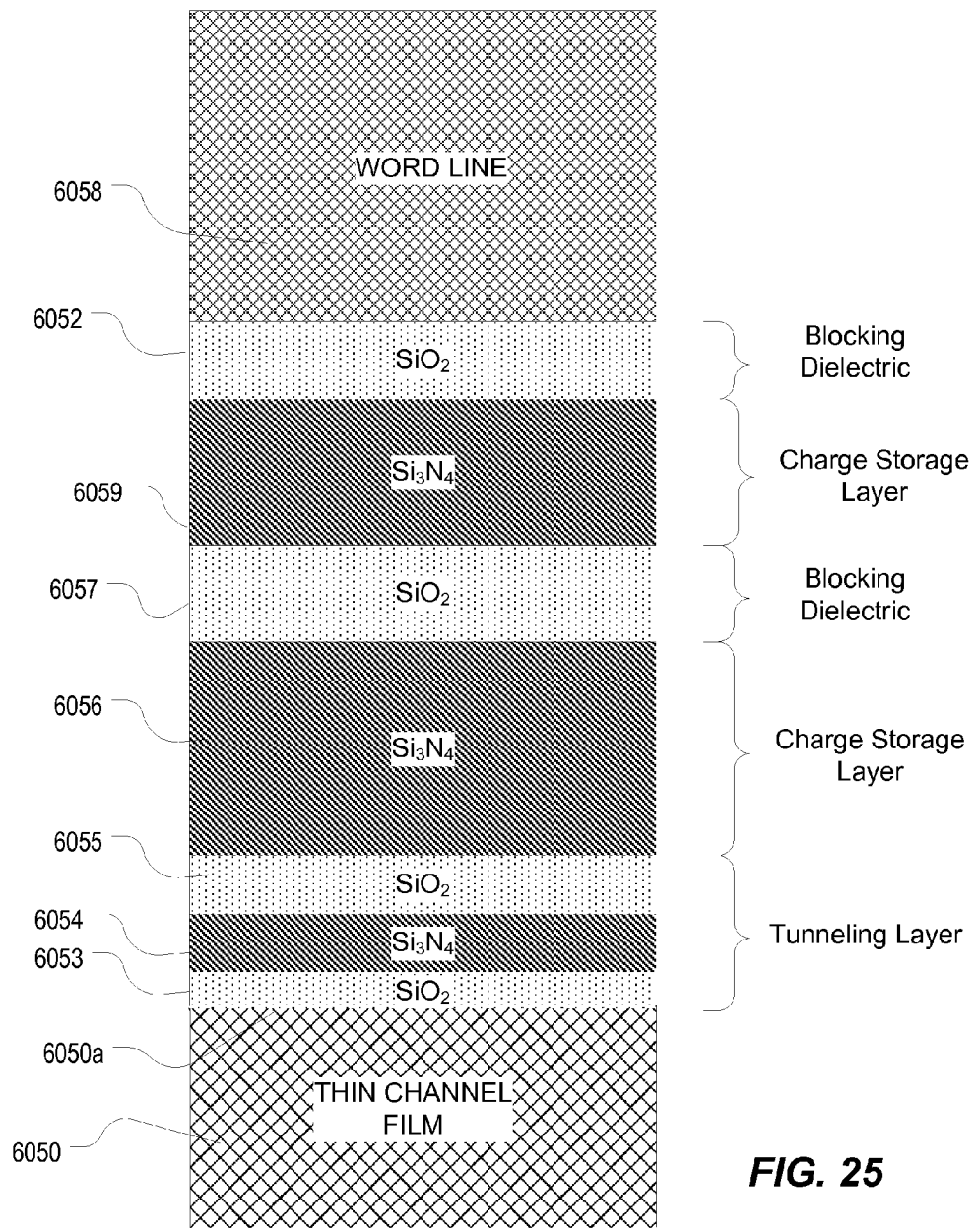
FIG. 25 illustrates one type of data storage structure which can be utilized in 3D NAND memory as described herein.

FIG. 25 is a simplified diagram of an improved BE-SONOS data storage structure that can be utilized in the techniques described herein. The data storage structure includes a tunneling layer in contact with the vertical channel structure 6050, comprises a composite of materials, and includes multiple layers such as a first tunneling layer 6053 of silicon oxide, a tunneling layer 6054 of silicon nitride, and a second tunneling layer 6055 of silicon oxide.

The first tunneling layer 6053 of silicon dioxide on the surface 6050a of the channel structure 6050 is formed for example using in-situ steam generation (ISSG) with optional nitridation by either a post deposition NO anneal or by addition of NO to the ambient during deposition. The thickness of the first tunneling layer 6053 of silicon dioxide is less than 20 Å, and preferably 7-15 Å. The first tunneling layer 6053 can be engineered with alternatives such as nitrided oxide for improved endurance, and/or fluorine treatments for improved interface state quality.

The tunneling layer of silicon nitride 6054, also referred to as a tunneling nitride layer, lies on the first tunneling layer 6053 of silicon oxide and is formed, for example, using LPCVD, using, for example, dichlorosilane DCS and $NH_3$ precursors at 680 degrees C. In alternative processes, the tunneling nitride layer 6054 comprises silicon oxynitride, made using a similar process with an $N_2O$ precursor. The thickness of the layer 6054 of silicon nitride is less than 30 Å, and preferably 10-30 Å, including for example 20 Å. Because of its thinness, layer 6054 is poor at storing charge.

Layer 6054 provides a low hole barrier height to facilitate hole injection for —FN erasing. However, layer 6054 has a low trapping efficiency. Various materials for layer 6054, along with their valence band offsets with silicon, are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 6055 of silicon dioxide lies on the tunneling layer 6054 of silicon nitride and is formed for example using LPCVD high temperature oxide (HTO) deposition. The thickness of the second tunneling layer 6055 of silicon dioxide is less than 45 Å, and preferably 15-45 Å, for example 30 Å. The second tunneling layer 6055 provides sufficient barrier thickness to block charge loss for improved charge retention. The second tunneling layer 6055 blocks direct tunneling leakage. Other low leakage oxides such as $Al_2O_3$ are possible.

A first charge storage layer 6056 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

A first blocking layer 6057 of silicon dioxide lies on the first charge storage layer 6056 and is formed for example using LPCVD HTO deposition. The thickness of the first blocking layer 6057 of silicon dioxide is less than 70 Å, including for example a range of 55-70 Å, including for example 50 Å. The first blocking layer 6057 provides sufficient barrier thickness to block charge mixing and charge transport between the charge storage layers 6056 and 6059. Other low leakage oxides such as $Al_2O_3$ are possible.

A second charge storage layer 6059 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 6059 traps electrons during —FN erasing to stop gate electron injection, allowing continuous erase of first charge storage layer 6056 by channel hole injection. High charge trapping efficiency alternatives are oxynitride, silicon-rich nitride, embedded nanoparticles, and $HfO_2$.

A second blocking layer 6052 of silicon dioxide lies on the second charge storage layer 6059 and is formed for example using LPCVD HTO deposition. The thickness of the second blocking layer 6052 of silicon dioxide is less than 60 Å, including for example a range of 30-60 Å, including for example 35 Å.

Finally, a layer 6058 of gate material, such as a thin film semiconductor layer configured as a vertical channel film, is formed on the second blocking layer 6052.

Figure 26:
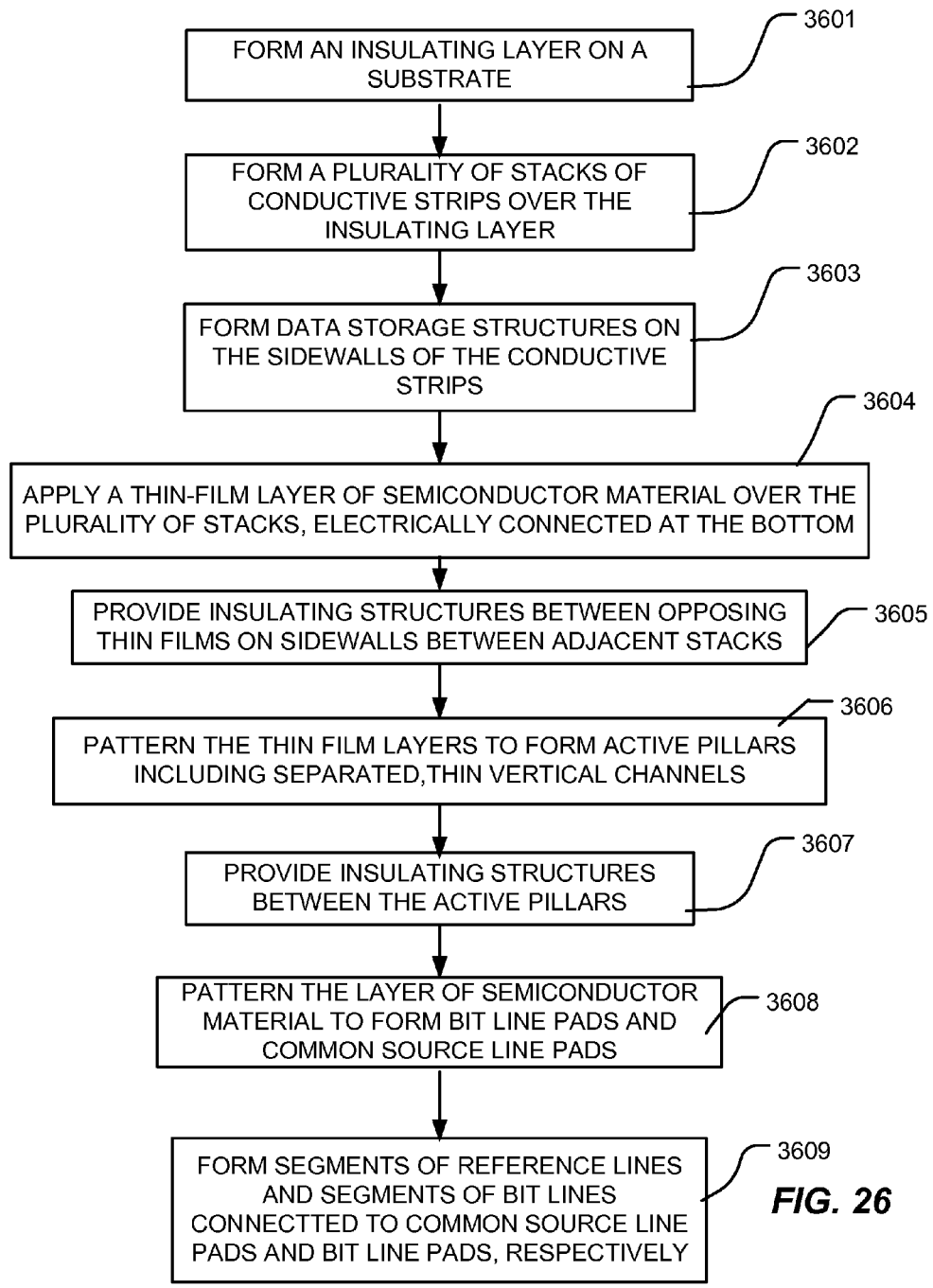
FIG. 26 is a flow chart illustrating a method for manufacturing a double gate vertical channel structure as described herein.

FIG. 26 is a flow chart illustrating a method for manufacturing a memory device. The reference line described herein can be the segment of the reference line; likewise, the bit line described herein can be the segment of the bit line. The method includes identifying areas on a substrate for formation of 3D memory blocks having a structure like that of FIG. 16. For each area, the method includes forming an insulating layer on the substrate by, for example, depositing a layer of silicon dioxide, or other dielectric material or combination of materials on the substrate (step 3601). Over the insulating layer (e.g., 1101 in FIG. 16), the process includes forming a plurality of layers of a first conductive material, suitable to act as word lines, separated by insulating material, and etching the plurality of layers to define a plurality of stacks (1111, 1112, etc. in FIG. 8) of conductive strips (step 3602). The stacks can include at least a bottom level of conductive strips (assist gates, AGs), a plurality of intermediate levels of conductive strips (WLs), and a top level of conductive strips (SSLs and GSLs).

The method includes forming data storage structures on side surfaces of conductive strips in the plurality of stacks, as shown in FIG. 9 (step 3603). The data storage structure can comprise a dielectric charge trapping structure as discussed above with reference to FIGS. 9 and 25. The data storage structure contacts side surfaces of the plurality of conductive strips.

The method includes forming a thin film layer (e.g. 1140 in FIG. 10) of a semiconductor material over and having a surface conformal with the memory layer on the plurality of stacks. The thin film extends down the sidewalls of the stacks, and connects at the bottom ends (step 3604).

An insulating structure (e.g. fill 1160 in FIG. 11) is provided between the opposing thin films on the sidewalls of adjacent stacks as discussed with reference to FIG. 11 (step 3605). In some embodiments, the insulating structure includes a seam at least in the regions of the memory cells being formed. This step of providing an insulating structure can comprise simply leaving the seam separating the thin films on the sidewalls of adjacent stacks without treatment.

Then, the structures between the pluralities of stacks of conductive strips are etched using a pattern of holes to define active pillars that include separated, thin vertical channel films in the regions of the memory cells as discussed with reference to FIG. 12 (step 3606). Insulating structures are provided between the active pillars, for example, by filling the holes formed during step 3606 with an insulating material (step 3607). The insulating structures can be fully filled with the insulating material, or the insulating structures can be partially filled with the insulating material so as to have gaps or voids because of the high aspect ratio.

The layer of semiconductor material overlying the stacks is patterned to define bit line pads and common source line pads (step 3608). The active pillars include one vertical channel film connected to a bit line pad (e.g. portion 2073 in FIG. 13), and one vertical channel film connected to a common source line pad (e.g. portion 2070 in FIG. 13). More than one active pillar can share a common source line pad. However, each active pillar is connected to a single bit line pad. The bit line/common source line pads can comprise semiconductor plugs.

The method can further include depositing a first level of patterned conductors comprising segments of reference lines (e.g. 2030 in FIG. 15) and inter-level connectors (e.g. 2031 in FIG. 15). Each of the segments of the reference lines is coupled to a reference voltage source and connected to more than one common source line pad, and each of the inter-level connectors is connected to one bit line pad. The segment of the reference line and the inter-level connector are comprised of the same conductive material. The inter-level connector is comprised of a plug comprised of a conductive material in a via through an interlayer dielectric connected to the bit line pad, and the segment of the reference line is comprised of the same conductive material in a trench through the interlayer dielectric connected to the common source line pad. The method can also include depositing a second level of patterned conductors comprising segments of bit lines coupled to sensing circuits, respective one of the segments of the bit lines having a plurality of extensions as discussed with reference to FIGS. 16 and 18-21 (step 3609). Also, the same or additional patterned conductor layers can include conductors coupled to the SSL strips, to the GSL strips and to the word line pads in the stacks of conductive strips.

As a result of forming the active pillars, memory cells are formed at each frustum of the pillars in interface regions at cross-points on opposing side surfaces of the conductive strips in the plurality of intermediate levels (WLs) with the thin vertical channel films of the plurality of bit line structures. Also, string select switches are disposed at interface regions with the top level of conductive strips (SSLs) in even stacks, and reference select switches are disposed at interface regions with the top level of conductive strips (GSLs) in odd stacks. The memory layer can comprise dielectric layers that can act as the gate dielectric layers for the string select switches and reference select switches.

With reference to FIG. 26 and other disclosure herein, several aspects of the manufacturing process can be understood. In one aspect, a manufacturing method is described which includes forming first and second stacks of conductive strips having sidewalls, forming data storage structures on the sidewalls of the first and second stacks, and forming first and second opposing vertical channel films on the data storage structures. The first and second opposing vertical channel films are connected to form a U-shaped current path which can be configured as a U-shaped NAND string. Also, a first pad is formed over the first stack connected to a first vertical channel film, and a second pad is formed over the second stack connected to the second vertical channel film. A segment of a reference line is formed to connect the first pad, and the first pad can comprise a semiconductor plug. An inter-level connector is formed to connect the second pad and the second pad can comprise a semiconductor plug. A segment of a bit line has an extension contacting the inter-level connector. As a result of the structure formed, a current path from the first pad over the first stack to the second pad over the second stack is provided through the semiconductor film, which can be operated as a U-shaped NAND string.

Figure 27:
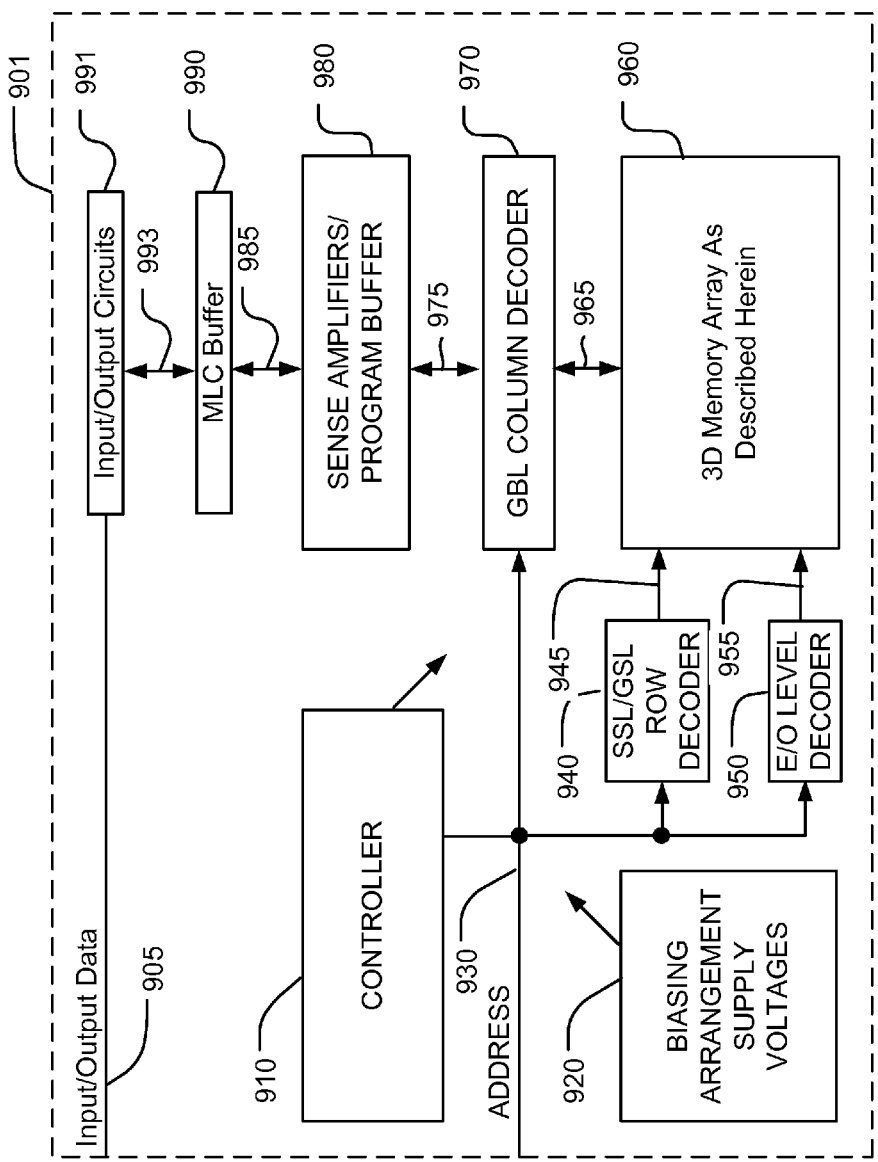
FIG. 27 is a block diagram of an integrated circuit memory including a 3D memory array having thin-channel film structures as described herein.

FIG. 27 is a simplified chip block diagram of an integrated circuit 901 including a 3D, vertical thin-channel film NAND array. The integrated circuit 901 includes a memory array 960 including one or more memory blocks as described herein with U-shaped NAND strings comprising vertical channel cells on an integrated circuit substrate.

An SSL/GSL decoder 940 is coupled to a plurality of SSL/GSL lines 945, arranged in the memory array 960. An even/odd level decoder 950 is coupled to a plurality of even/odd word lines 955. A global bit line column decoder 970 is coupled to a plurality of global bit lines 965, arranged along columns in the memory array 960 for reading data from and writing data to the memory array 960. The global bit lines are configured to bit lines 2060-2062 with associated extensions 2041-2043, 2045-2046 as illustrated in FIG. 16. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits 980 are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 27, control logic 910, using a bias arrangement state machine, controls the application of supply voltages generated or provided through the voltage supply or supplies in block 920, such as read, erase, verify and program bias voltages. The control logic 910 is coupled to the multi-level data buffer 990 and the memory array 960. The control logic 910 includes logic to control multiple-level program operations. In embodiments supporting the U-shaped vertical NAND structures described herein, the logic is configured to perform the method of: selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches and GSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$. As mentioned above, single-bit-per-cell embodiments can include the structures described herein.

While the present invention is disclosed by reference to the preferred HI embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   first and second stacks of conductive strips having sidewalls;
   data storage structures on the sidewalls of the first and second stacks;
   first and second vertical channel films on the data storage structures on the sidewalls of the first and second stacks, each first vertical channel film including a first pad over the first stack on an upper end of the first vertical channel film, and each second vertical channel film including a second pad over the second stack on an upper end of the second vertical channel film, the first and second vertical channel films being connected at bottom ends;
   a first level of patterned conductors overlying the first and second stacks, the patterned conductors in the first level comprising a segment of a reference line and an inter-level connector, the segment of the reference line connected to the first pad, the inter-level connector connected to the second pad;
   a second level of patterned conductors over the first level, the patterned conductors in the second level comprising a segment of a bit line, the segment of the bit line including an extension contacting the inter-level connector; and
   a multilayered insulating structure over the first level, the multilayered insulating structure comprising a first insulating film, a second insulating film and a third insulating film, the extension comprising a fin within the first and second insulating films.

2. The memory device of claim 1, wherein the segment of the reference line is comprised of a conductive material and the inter-level connector is comprised of the same conductive material.

3. The memory device of claim 1, wherein the inter-level connector is comprised of a plug comprised of a conductive material in a via through an interlayer dielectric connected to the second pad, and the segment of the reference line is comprised of the conductive material in a trench through the interlayer dielectric connected to the first pad.

4. The memory device of claim 1, wherein the extension has two sides aligned with the segment of the bit line.

5. The memory device of claim 1, wherein the first and third insulating films comprise the same material, and comprise different material than the second insulating film.

6. The memory device of claim 1, wherein the segment of the reference line is disposed in direct contact with the first pad.

7. The memory device of claim 6, wherein the first pad includes a semiconductor plug over the first stack and in direct contact with the segment of the reference line.

8. A memory device, comprising:
   first and second stacks of conductive strips having sidewalls;
   a plurality of U-shaped films having outside surfaces contacting data storage structures on sidewalls of the first and second stacks;
   a plurality of first pads connected to ends of the U-shaped films in the plurality over the first stack and a plurality of second pads connected to the other ends of the U-shaped films in the plurality over the second stack;
   a first level of patterned conductors overlying the first and second stacks, the patterned conductors in the first level comprising a segment of a reference line and a plurality of inter-level connectors, the segment of the reference line connected to the first pads in the plurality, the inter-level connectors in the plurality connected to the second pads in the plurality;
   a second level of patterned conductors over the first level, the patterned conductors in the second level comprising a segment of a bit line, the segment of the bit line including a plurality of extensions contacting the inter-level connectors in the plurality; and
   a multilayered insulating structure over the first level, the multilayered insulating structure comprising a first insulating film, a second insulating film and a third insulating film, a respective one of the extensions in the plurality comprising a fin within the first and second insulating films.

9. The memory device of claim 8, wherein a respective one of the extensions in the plurality has two sides aligned with the segment of the bit line.

10. The memory device of claim 9, wherein the second and third insulating films are made of different materials.

11. The memory device of claim 8, wherein the segment of the reference line is disposed in direct contact with the first pads in the plurality.

12. The memory device of claim 8, wherein respective one of the first pads in the plurality includes a semiconductor plug over the first stack and in direct contact with the segment of the reference line.

13. A method of manufacturing a memory device, comprising:
   forming first and second stacks of conductive strips having sidewalls;
   forming data storage structures on the sidewalls of the first and second stacks;
   forming a plurality of U-shaped films on the data storage structures and between the stacks, a respective one of the U-shaped films in the plurality having a first pad over the first stack and a second pad over the second stack;
   depositing a first level of patterned conductors to provide a segment of a reference line connected to the first pad and an inter-level connector connected to the second pad; and
   depositing a second level of patterned conductors to provide a segment of a bit line, the segment of the bit line including an extension contacting the inter-level connector,
   wherein the extension comprises a fin having sides aligned with the segment of the bit line, and having other opposing sides aligned with a second insulating film.

14. The method of claim 13 further comprising:
   depositing a first insulating film and a second insulating film over the first level;
   patterning a hole in the second insulating film;
   depositing a third insulating film over the patterned second insulating film;
   patterning a strip in the third insulting film;
   removing portions of the first, second and third insulating films to expose the top surface of the inter-level connector; and
   filling the removed portions of the first, second and third insulating films with a conductive material layer.

15. The method of claim 14 further comprising polishing the conductive material layer to expose the third insulating film.

16. The method of claim 14, wherein the second insulating film can be silicon nitride or silicon carbide.

17. The method of claim 14, wherein the extension comprises a fin within the first and second insulating films.

\* \* \* \* \*